United States Patent
Uemichi

(10) Patent No.: US 10,511,077 B2
(45) Date of Patent: Dec. 17, 2019

(54) METHOD FOR MANUFACTURING MODE CONVERTER

(71) Applicant: FUJIKURA, LTD., Tokyo (JP)

(72) Inventor: Yusuke Uemichi, Sakura (JP)

(73) Assignee: FUJIKURA LTD., Tokyo (JP)

( * ) Notice: Subject to any disclaimer, the term of this patent is extended or adjusted under 35 U.S.C. 154(b) by 615 days.

(21) Appl. No.: 14/825,682

(22) Filed: Aug. 13, 2015

(65) Prior Publication Data
US 2015/0349398 A1 Dec. 3, 2015

Related U.S. Application Data

(63) Continuation of application No. PCT/JP2014/053453, filed on Feb. 14, 2014.

(30) Foreign Application Priority Data

Feb. 18, 2013 (JP) ................. 2013-029486

(51) Int. Cl.
*H01P 11/00* (2006.01)
*H01P 5/107* (2006.01)
(Continued)

(52) U.S. Cl.
CPC ............ *H01P 11/003* (2013.01); *H01P 5/107* (2013.01); *H05K 1/0251* (2013.01); *H05K 3/002* (2013.01);
(Continued)

(58) Field of Classification Search
CPC ................... H01P 5/107; H01P 11/003; H05K 3/18–188; H05K 3/42–429; H05K 3/0029
See application file for complete search history.

(56) References Cited

U.S. PATENT DOCUMENTS 3,956,052 A * 5/1976 Koste ................... C04B 41/009
156/247
4,716,387 A 12/1987 Igarashi
(Continued)

FOREIGN PATENT DOCUMENTS

EP 2 940 784 A1 11/2015
JP 62-58907 U 4/1987
(Continued)

OTHER PUBLICATIONS

Derwent Abstract of Research Article 257043, published Sep. 10, 1985, entitled "Excimer Laser Patterning of Green Sheet Ceramics—Giving Highly Conductive, Densely Packaged Pattern of Connecting Paths Between Chips by Ablative Decomposition of Greet Sheet Polymer". (Year: 1985).*
(Continued)

*Primary Examiner* — Livius R. Cazan
(74) *Attorney, Agent, or Firm* — Sughrue Mion, PLLC

(57) ABSTRACT

A method for manufacturing a mode converter including a substrate that is a single member and includes a first main surface, a second main surface opposite to the first main surface, and a micro hole which is formed in the first main surface, grounding conductor layers that are formed on the first main surface and the second main surface, a plane circuit that is formed on the first main surface, and a pin that is formed so as to cover an inner surface of the micro hole and is electrically connected to the plane circuit, the method includes: irradiating the substrate with laser light to form a first modified portion to a desired depth from one main surface of the substrate; removing the first modified portion to form the micro hole; and filling the micro hole with a conductive material to form the pin.

3 Claims, 21 Drawing Sheets

(51) Int. Cl.
    *H05K 1/02* (2006.01)
    *H05K 3/00* (2006.01)
(52) U.S. Cl.
    CPC ..... *H05K 3/0029* (2013.01); *H05K 2201/037* (2013.01); *H05K 2201/09509* (2013.01); *H05K 2201/09545* (2013.01); *H05K 2203/0733* (2013.01); *Y10T 29/49018* (2015.01)

(56) References Cited

U.S. PATENT DOCUMENTS

| | | | |
|---|---|---|---|
| 5,045,820 A | 9/1991 | Leicht et al. | |
| 5,545,308 A * | 8/1996 | Murphy | C08G 61/124 205/125 |
| 5,801,599 A | 9/1998 | Flynn et al. | |
| 5,982,256 A | 11/1999 | Uchimura et al. | |
| 2002/0130739 A1 | 9/2002 | Cotton | |
| 2004/0041651 A1* | 3/2004 | Shono | H01P 5/107 333/26 |
| 2013/0154759 A1* | 6/2013 | Morita | H01P 3/081 333/26 |

FOREIGN PATENT DOCUMENTS

| | | | |
|---|---|---|---|
| JP | 3-77402 A | | 4/1991 |
| JP | 10-135714 A | | 5/1998 |
| JP | 10303611 A | * | 11/1998 |
| JP | 2005-294881 A | | 10/2005 |
| JP | 2008-288577 A | | 11/2008 |
| JP | 2008288577 A | * | 11/2008 |
| JP | 2011-109438 A | | 6/2011 |
| WO | 99/53564 A1 | | 10/1999 |
| WO | 2014/104336 A1 | | 7/2014 |

OTHER PUBLICATIONS

Ihlennann, J., Scholl, A., Schmidt, H. et al. Appl. Phys. A (1995) 60: 411. https://doi.org/10.1007/BF01538343 (Year: 1995).*

Toyoda, I, et al. "Three-Dimensional MMIC and Its Application: An Ultra-Wideband Miniature Balun", 2334c IEICE Transactions on Electronics, Institute of Electronics Tokyo JP, vol. E78-C, No. 8, Aug. 1, 1995, pp. 919-924, XP000536069, ISSN: 0916-8524.

Communication dated Oct. 6, 2016, from the European Patent Office in counterpart European application No. 14751763.5.

Communication dated Jun. 28, 2016 from the Japanese Patent Office in counterpart Application No. 2013-029486.

Ryosuke Suga, et al., "Cost-Effective 60-GHz Antenna-Package with End-Fire Radiation from Open-Ended Post-Wall Waveguide for Wireless File-Transfer System", 2010 IEEE MTT-S International Microwave Symposium, pp. 449-452.

* cited by examiner

METHOD FOR MANUFACTURING MODE CONVERTER

CROSS REFERENCE TO RELATED APPLICATIONS

This application is a continuation application based on a PCT Patent Application No. PCT/JP2014/053453, filed Feb. 14, 2014, whose priority is claimed on Japanese Patent Application No. 2013-029486, filed Feb. 18, 2013, the entire content of which are hereby incorporated by reference.

BACKGROUND OF THE INVENTION

Field of the Invention

The present invention relates to a mode converter and a method for manufacturing the same, and more particularly, to a technique that is used for a mode converter for millimeter-wave band communication.

Priority is claimed on Japanese Patent Application No. 2013-029486, filed Feb. 18, 2013, the content of which is incorporated herein by reference.

Description of the Related Art

In recent years, high-capacity communication which uses a millimeter-wave band and has a high transmission speed of several gigabits per second [Gbps] has been proposed and a portion thereof has been achieved. In particular, the importance of a wireless communication device which operates in a band of 60 [GHz] has increased. In Japan, it is possible to use a wide frequency band of 59 [GHz] to 66 [GHz], without a license. Therefore, the wireless communication device is expected to be spread to the household sector. Therefore, the most urgent task is to achieve an inexpensive and small millimeter-wave communication module.

R. Suga, et al., "Cost-Effective 60-GHz Antenna-Package with End-Fire Radiation from Open-Ended Post-Wall Waveguide for Wireless File-Transfer System," 2010 IEEE MTT-S International Microwave Symposium, pp. 449-452 (hereinafter referred to as NPL 1) and Japanese Unexamined Patent Application, First Publication No. 2011-109438 (hereinafter referred to as PTL 1) disclose a millimeter-wave module using a waveguide (post-wall waveguide antenna: PWA) which is formed by a printed circuit board as a technique for achieving a small and inexpensive millimeter-wave communication module.

As shown in FIGS. 1 to 7 of PTL 1, in the technique disclosed in PTL 1, the side wall (metal wall) of a waveguide according to the related art is replaced with a through hole group (post group) of the printed circuit board. As shown in FIGS. 1 to 7 of PTL 1, a wireless communication IC (CMOS-IC) is mounted on the PWA. A millimeter-wave signal which is output from an IC (which is referred to as a semiconductor chip 4 in the specification of PTL 1; which holds for the following description) by a method, such as wire bonding or bump connection, is transmitted through a transmission line (which is referred to as a line 24 such as a microstrip, a coplanar strip, or a strip) formed by a plane circuit once. Then, the millimeter-wave signal is finally transmitted to a waveguide structure portion (which is referred to as a waveguide 2) through a plane circuit/waveguide conversion structure (which is referred to as a central conductor 23).

FIG. 28 shows an example of the structure of a mode converter (converter) according to the related art. As shown in FIG. 28, in a mode converter 510, a waveguide 502 includes an opening portion 525 which is provided in a forward end surface (the right side of FIG. 28) and from which radio waves are radiated. The waveguide 502 includes a plurality of post (column) walls 520 and upper and lower grounding conductor layers (cooper films) 521 and 522. A pin (plane circuit/waveguide converter) 523 is inserted as a feed portion into the waveguide 502. A millimeter-wave signal which is introduced from a transmission line 524 to the pin 523 is radiated as electromagnetic waves from the opening portion 525 provided on the front side of the waveguide 502. The mode converter 510 is formed by laminating a plurality of substrates 528A, 528B, and 528C. The pin 523 is formed by laminating the substrates 528B and 528C in which vias are formed in advance and by filling the vias with a conductive material.

In the design of a general high-frequency circuit, when a circuit A and a circuit B are connected to each other, it is necessary to perform impedance matching. This means that a signal is transmitted without being reflected at a connection point between the circuit A and the circuit B. That is, a signal needs to be transmitted without being reflected at a connection point between a plane circuit/transmission line as the circuit A and the waveguide as the circuit B.

In the structure shown in FIG. 28, in a predetermined frequency band, the length of the pin 523 is adjusted to a predetermined value to adjust impedance. As a result, signal transmission with low reflection loss is achieved. In addition, a method for optimizing the distance between the pin 523 and the grounding conductor layer 522 is considered as one of impedance matching means.

However, in a method for manufacturing the converter according to the related art, the vias are formed in advance in a plurality of substrates whose thickness has been determined and the plurality of substrates are laminated to manufacture the pin. Therefore, the length of the pin depends on the thickness of the substrates and is set to only a discrete value. As a result, it is difficult to set the length of the pin to a desired value. In addition, it is difficult to set the thickness of each of the substrates to be laminated and the thickness of each substrate depends on the availability of a material. Therefore, it is difficult to obtain a pin with an optimal length.

When reflection loss is reduced by means other than the adjustment of the length of the pin, the means are likely to be a band limiting factor which causes a reduction in an available band. Therefore, the means are not the best method.

In addition, for example, the following undesirable situations occur: transmission loss caused by an adhesive which is used to attach the substrates; a variation in transmission characteristics caused by the material forming each layer; and the positional deviation between the substrates when the substrates are laminated.

The invention has been made in view of the above-mentioned problems and an object of the invention is to provide a method for manufacturing a mode converter which achieves signal transmission with low reflection loss and facilitates impedance matching.

SUMMARY

A first aspect of the present invention provides a method for manufacturing a mode converter including a substrate that is a single member and includes a first main surface, a second main surface opposite to the first main surface, and a micro hole which is formed in the first main surface and has a predetermined depth, grounding conductor layers that are formed on the first main surface and the second main surface, a plane circuit that is formed on the first main surface and is configured to transmit a high-frequency signal, and a pin that is formed so as to cover an inner surface of the micro hole and is electrically connected to the plane circuit, the method including: irradiating the substrate with laser light and thereby forming a first modified portion to a predetermined depth from one main surface of the substrate; removing the first modified portion and thereby forming the micro hole; and filling the micro hole with a conductive material to form the pin.

According to the invention, it is possible to adjust the length of the modified portion which is formed in the single substrate by laser modification and thus to adjust the length of the pin. Therefore, it is possible to achieve a pin with a predetermined length, without the length of the pin being a discrete value, unlike the related art. As a result, it is not necessary to adjust the length of the pin using, for example, other circuit elements and it is possible to achieve a mode converter with low reflection loss.

In addition, the substrate is not a laminate of a plurality of substrates, but can be a substrate including a single base. Therefore, it is possible to avoid many undesirable situations, such as loss which is caused by an adhesive when a plurality of bases are laminated, a variation in characteristics caused by a material forming each layer, and positional deviation which occurs when layers are laminated.

In the method for manufacturing a mode converter according to above aspect, the grounding conductor layer may be formed at the same time as the pin is formed.

According to the above-mentioned aspect of the invention, the pin and the grounding conductor layer can be formed by the same process. Therefore, it is possible to reduce the number of processes and to improve manufacturing efficiency.

In the method for manufacturing a mode converter according to above aspect, the mode converter may further includes an electromagnetic wave shielding portion that passes through the substrate from the first main surface to the second main surface and is arranged so as to surround the micro hole in a plan view, when the first modified portion is formed, the substrate may be irradiated with the laser light and a second modified portion is formed so as to extend from the first main surface to the second main surface and to surround the micro hole in a plan view, the second modified portion may be removed at the same time as the first modified portion is removed, and a portion from which the second modified portion is removed may be filled with a conductive material to form the electromagnetic wave shielding portion at the same time as the micro hole is filled with the conductive material.

According to the above aspect of the invention, the pin and the electromagnetic wave shielding portion can be formed by the same process. Therefore, it is possible to reduce the number of processes and to improve manufacturing efficiency.

A second aspect of the present invention provides a mode converter including: a substrate that is a single member and includes a first main surface, a second main surface opposite to the first main surface, and a micro hole which is formed in the first main surface and has a predetermined depth; grounding conductor layers that are formed on the first main surface and the second main surface; a plane circuit that is formed on the first main surface and is configured to transmit a high-frequency signal; and a pin that is formed so as to cover an inner surface of the micro hole and is electrically connected to the plane circuit.

In the mode converter according to above aspect, the grounding conductor layer and the pin may be made of the same conductive material.

In the mode converter according to above aspect, an electromagnetic wave shielding portion that passes through the substrate from the first main surface to the second main surface and may be arranged so as to surround the micro hole in a plan view.

In the mode converter according to above aspect, the electromagnetic wave shielding portion may include a plurality of conductor posts that may be arranged so as to be separated from each other.

In the mode converter according to above aspect, the electromagnetic wave shielding portion may include a conductor post and a conductor wall that is continuous in at least one direction in a plan view.

According to the method for manufacturing the mode converter of the above aspects, it is possible to freely adjust the length of the pin and to achieve a mode converter which can reduce reflection loss, without adjusting the length of the pin using, for example, other circuit elements.

DETAILED DESCRIPTION OF THE PREFERRED EMBODIMENTS

Hereinafter, preferred embodiments of the invention will be described with reference to the drawings. The following embodiments are illustrative examples for ease of understanding of the purpose of the invention and do not limit the invention unless otherwise specified. In some cases, in the following drawings, for convenience, a main portion is enlarged in order to facilitate the understanding of characteristics of the invention and the dimensions and scale of each component may be different from the actual dimensions and scale. In addition, for convenience, some portions are omitted in order to facilitate the understanding of characteristics of the invention.

[Structure of Mode Converter]

Figure 1:
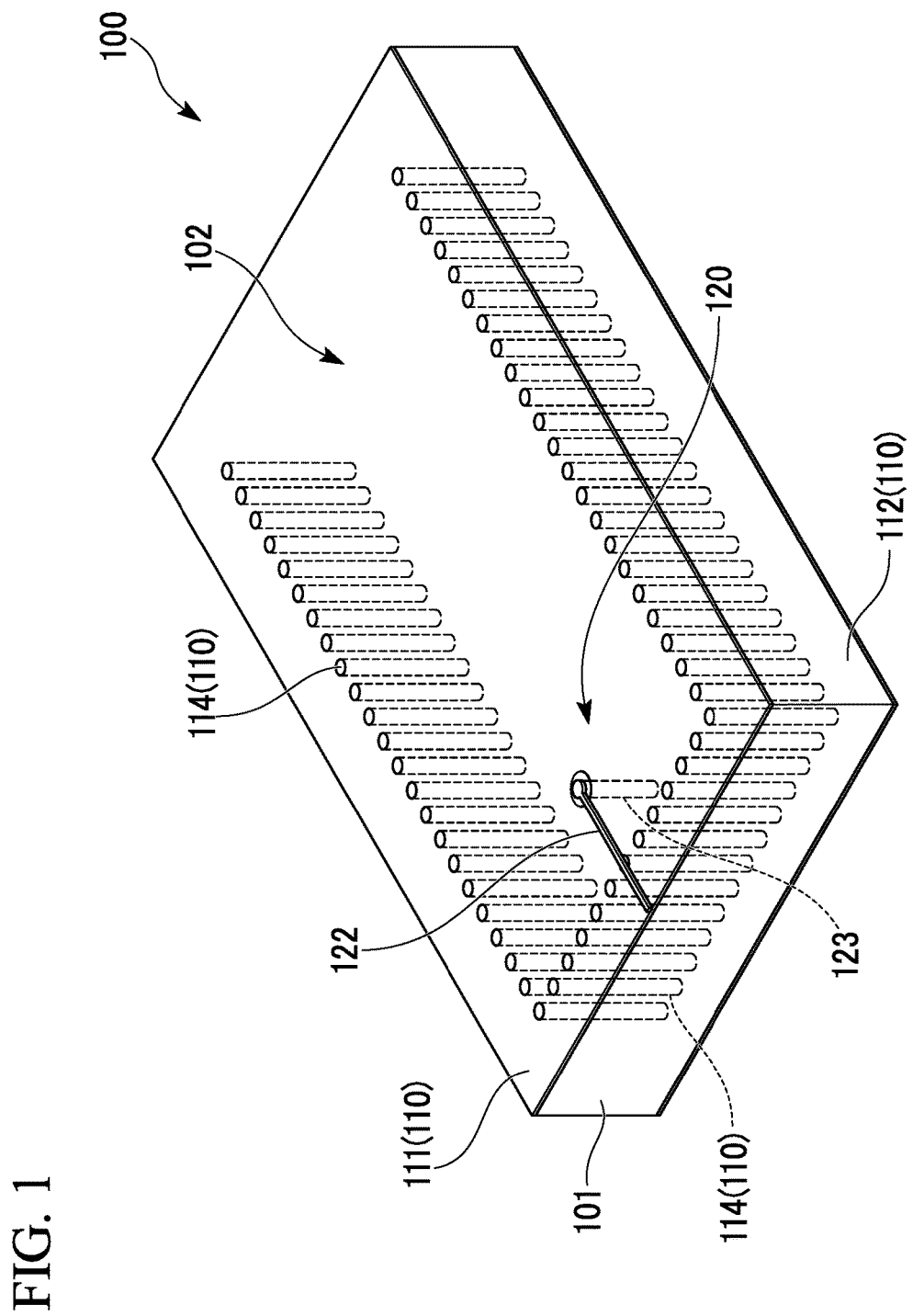
FIG. 1 is a perspective view showing a waveguide in a method for manufacturing a mode converter according to an embodiment of the invention.
Figure 2:
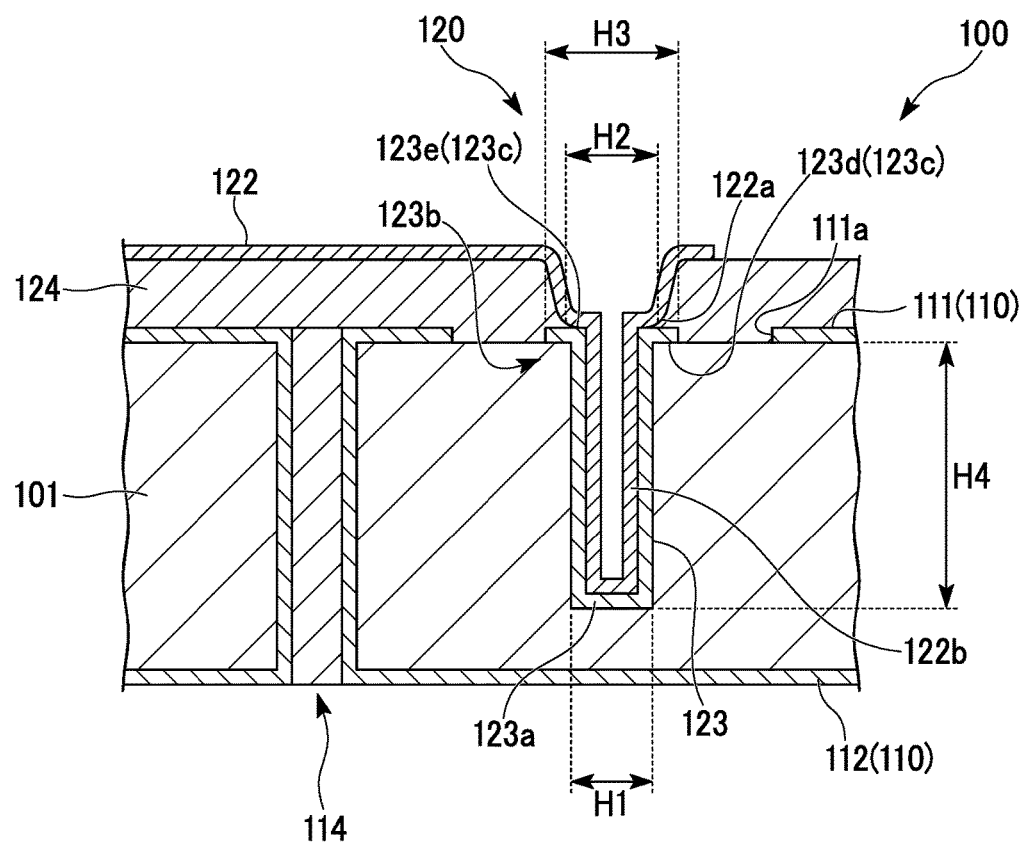
FIG. 2 is a front sectional view showing the mode converter according to the embodiment of the invention.
Figure 3:
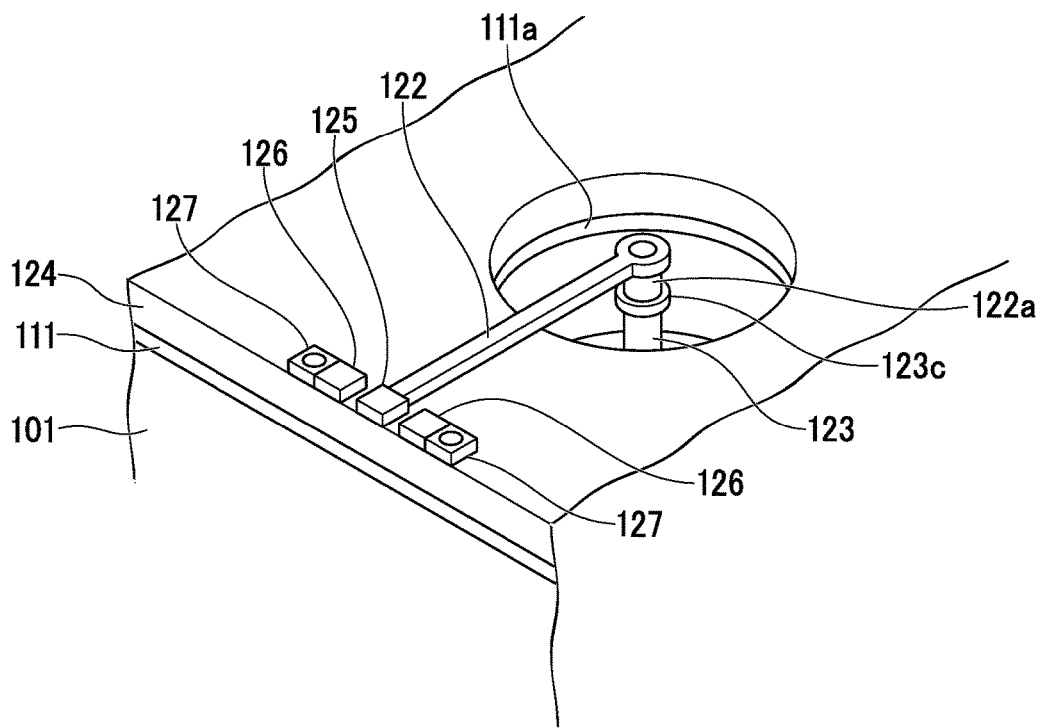
FIG. 3 is a perspective view showing the method for manufacturing the mode converter according to the embodiment of the invention.
Figure 4:
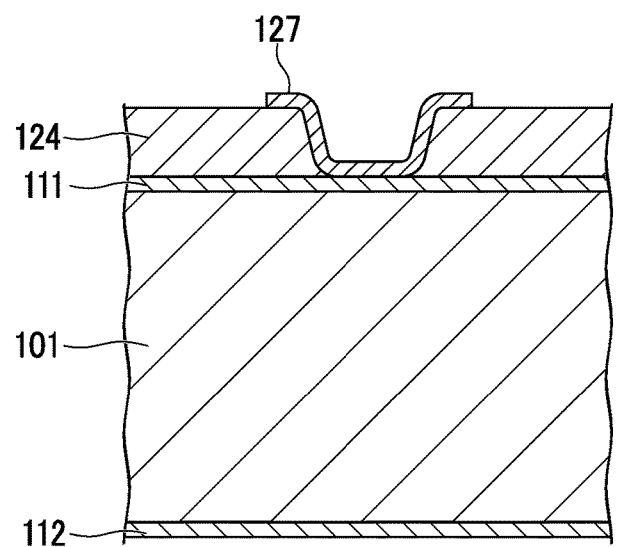
FIG. 4 is an enlarged cross-sectional view showing a GND via in the method for manufacturing the mode converter according to the embodiment of the invention.
Figure 5:
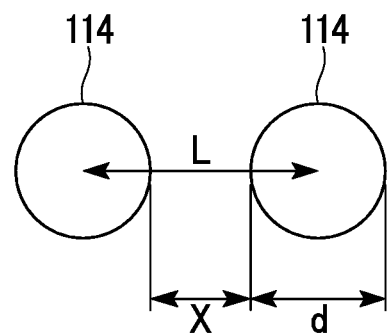
FIG. 5 is a plan view schematically showing a reflecting portion in the method for manufacturing the mode converter according to the embodiment of the invention.

The structure of a mode converter 100 according to a first embodiment of the invention will be described with reference to FIGS. 1 to 5. FIG. 1 is a perspective view schematically showing the structure of the mode converter 100. FIG. 2 is a cross-sectional view showing an example of the structure of the mode converter 100. FIG. 3 is an enlarged perspective view schematically showing a structure extending from a plane circuit to a pin. FIG. 4 is a cross-sectional view schematically showing a GND connection via. FIG. 5 is a plan view schematically showing conductor posts 114 which form a reflecting portion. In the drawings, reference numeral 100 denotes a mode converter.

As shown in FIGS. 1 and 2, the mode converter 100 according to this embodiment includes a glass substrate (substrate) 101 which is a single member (an integrated structure), an excitation pin structure 120 having a plane circuit (transmission path) 122 that can transmit a high-frequency signal and a pin (which is also referred to as a conductor pin) 123, first and second grounding conductor layers 111 and 112 which are connected to the ground potential of the reflecting portion, the conductor posts 114, and a waveguide 110.

The glass substrate which is a single member is not a laminated substrate of a plurality of substrates or a composite substrate, but is a glass substrate made of a single material. For example, a quartz substrate or a semiconductor substrate that transmits electromagnetic waves may be used, instead of the glass substrate.

The first grounding conductor layer 111 is provided on a front surface of the glass substrate 101.

The second grounding conductor layer 112 is provided on a rear surface of the glass substrate 101. A plurality of conductor posts 114 (electromagnetic wave shielding portion) are a plurality of post walls which are vertically provided between the first and second grounding conductor layers 111 and 112 and are arranged in a U-shape in the plan view of the glass substrate 101.

The waveguide 110 is provided inside the plurality of conductor posts 114 (electromagnetic wave shielding portion) which are arranged in a U-shape in a plan view between the first grounding conductor layer 111 and the second grounding conductor layer 112. The waveguide 110 functions as a path through which an electromagnetic wave signal radiated from the pin 123 is propagated. The first and second grounding conductor layers 111 and 112 and the conductor posts 114 are not provided at one end of the waveguide 110 and the one end of the waveguide 110 is an opening portion (electromagnetic waves radiation portion) 102 from which the electromagnetic wave signal is radiated.

Each component will be described in detail below.

The first and second grounding conductor layers 111 and 112 are, for example, cooper thin films which are provided on the front and rear surfaces of the glass substrate 101 and are provided on the entire front and rear surfaces of the glass substrate 101 except for at least a peripheral region of the pin 123.

As shown in FIG. 1, the plurality of conductor posts 114 are made of the same material as the grounding conductor layers 111 and 112 and pass through the glass substrate 101. The ends of the conductor posts 114 are connected to the grounding conductor layer 111 and the grounding conductor layer 112. The plurality of conductor posts 114 are arranged in a substantially rectangular U-shape which is parallel to three sides except for one side corresponding to the opening portion 102 among four sides of the glass substrate 101 in a plan view. The arrangement of the plurality of conductor posts 114 is set such that a high-frequency signal radiated from the pin 123 does not leak to the outside.

Specifically, when adjacent conductor posts 114 are arranged so as to be separated from each other, a distance L between the central axes of the conductor posts 114 is set so as to be less than two times the diameter d of the conductor post 114, as shown in FIG. 5. That is, a gap X between the closest conductor posts 114 is set so as to be less than the diameter d of the conductor post 114.

As shown in FIGS. 1 to 3, the excitation pin structure 120 of the mode converter 100 includes the pin 123 which is formed so as to extend from an opening 111a provided in the first grounding conductor layer 111 to the inside of the glass substrate 101 and the plane circuit (transmission path) 122 which is connected to the outer surface of the pin 123 and is located above the first grounding conductor layer 111.

An insulating portion 124 with a substantially constant thickness is provided on the first grounding conductor layer 111 and the transmission path 122 is formed on the outer surface of the insulating portion 124. The transmission path 122 is provided so as to overlap at least an opening region (111a) of the first grounding conductor layer 111 in the thickness direction of the substrate. The transmission path 122 has one end that is connected to an upper base end of the pin 123 and the other end that is connected to a GSG pad 125 on the insulating portion 124 and becomes a microstrip line. As shown in FIG. 3, two GND pads 126 are provided on both sides of the GSG pad 125 so as to be separated from each other and to be arranged in two regions partitioned by the transmission path 122 on the insulating portion 124. As shown in FIG. 3, a GND via 127 is adjacent to a side of each GND pad 126 that is opposite to the GSG pad 125. As shown in FIG. 4, the GND via 127 is provided so as to extend from the surface of the transmission path 122 on the insulating portion 124 to the surface of the first grounding conductor layer 111 below the insulating portion 124. In this embodiment, an "upper direction" means a direction from the rear surface to the front surface of the substrate in the thickness direction.

As shown in FIG. 2, the pin 123 includes a cylindrical body having one end that is a closed leading end 123a on a disk and has a substantially constant outside diameter H1. The pin 123 is formed in the glass substrate 101 so as to be vertical with respect to the front and rear surfaces of the glass substrate 101. A length H4 is set such that the leading end 123a arranged in the substrate does not come into contact with the second grounding conductor layer 112, which will be described below. A base end 123b which is the other end of the cylindrical body of the pin 123 is formed in the front surface of the glass substrate 101 which is the same surface of the first grounding conductor layer 111. In addition, the pin 123 includes a flange-shaped land 123c which is provided on the front surface of the glass substrate 101 so as to extend from the other end of the cylindrical body to the outside in a radial direction and is made of the same material as the first grounding conductor layer 111. The land 123c has a circular ring shape in a plan view in which a surface outer edge portion 123d is provided in the outer circumference and a circular ring portion 123e is provided in the inner circumference. The surface outer edge portion 123d is covered with the insulating portion 124. The upper surface of the circular ring portion 123e is covered with a conductor 122a which extends from the transmission path 122 and has a diameter that increases toward the thickness direction of the insulating portion 124. The circular ring portion 123e is electrically connected to the transmission path 122 through the conductor 122a. The inner surface (inside) of the pin 123 is covered with a conductor 122b connected to the conductor 122a.

The outside diameter H3 of the surface outer edge portion 123d (the outside diameter of the land 123c), the outside diameter H2 of the conductor 122a which comes into contact with the land 123c, and the outside diameter H1 of the cylindrical body of the pin 123 are set such that H3>H2>H1 is satisfied.

At least the inner surface of the pin 123 is made of a conductor, such as Cu, Ag, or Au. A central portion of the pin 123 may have a hollow structure or a structure in which it is filled with, for example, the same conductor as that forming the front surface or an insulating resin. The conductor can be formed by, for example, a plating method and a conductive paste filling method.

Figure 6A:
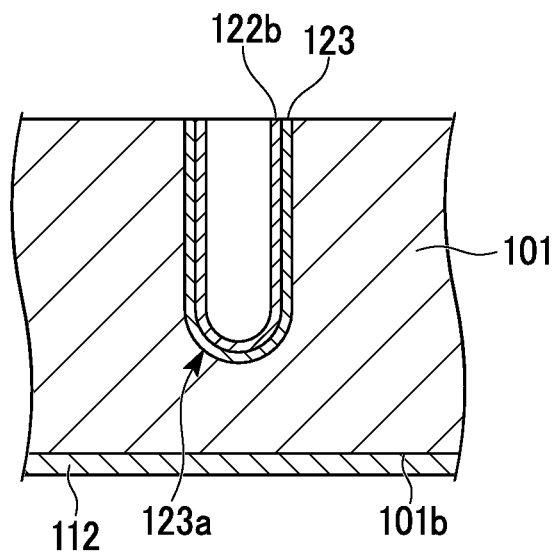
FIG. 6A is a cross-sectional view schematically showing an example of a pin in the method for manufacturing the mode converter according to the embodiment of the invention.
Figure 6B:
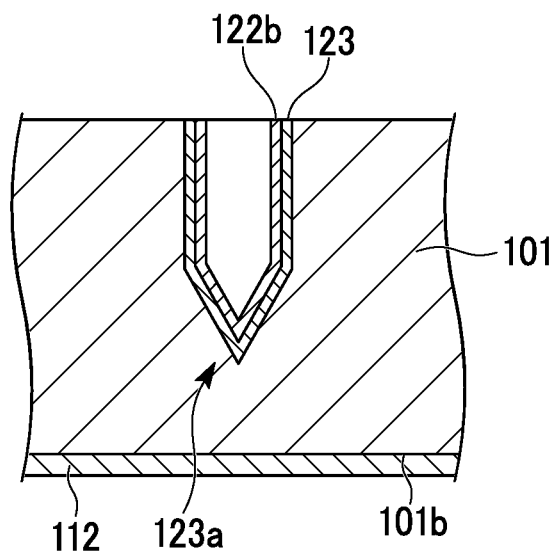
FIG. 6B is a cross-sectional view schematically showing an example of the pin in the method for manufacturing the mode converter according to the embodiment of the invention.
Figure 6C:
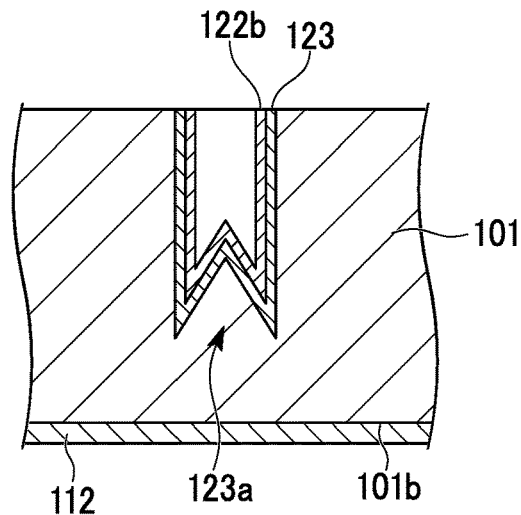
FIG. 6C is a cross-sectional view schematically showing an example of the pin in the method for manufacturing the mode converter according to the embodiment of the invention.

FIGS. 6A to 6C show the shapes of the leading end of the pin 123 according to other embodiments. As shown in FIG. 6A, the pin 123 may have an end-rounded shape in which the leading end 123a is rounded. Alternatively, as shown in FIGS. 6B and 6C, the pin 123 may have a shape in which the leading end is acute. When the pin 123 has the acute leading end as shown in FIGS. 6B and 6C, the accuracy required to control the distance between the leading end of the pin and the second grounding conductor layer 112 is reduced, which is preferable. As a result, it is easy to perform impedance matching during manufacturing.

The transmission path 122, the pin 123, the first grounding conductor layer 111, the second grounding conductor layer 112, and the conductor post 114 are formed by sequentially laminating a film made of titanium (Ti) or chrome (Cr) and a film made of copper (Cu) from the front surface side of the glass substrate 101 or the insulating portion 124. It is preferable to minimize the thickness of the film made of Ti or Cr to the extent that the accuracy of adhesion to the substrate is not damaged. For example, when the thickness of the film made of Cu is equal to or greater than 300 nm, it is preferable that the thickness of the film made of Ti or Cr is approximately 40 nm. In this case, both the transmission path 122 and the pin 123 are suitable for transmitting electromagnetic waves in a millimeter-wave band. For example, a copper portion can be a plated layer which will be described below.

[Method for Manufacturing Waveguide]

A method for manufacturing the mode converter 100 shown in FIGS. 1 to 5 will be described with reference to FIGS. 7A to 7P.

Figure 7A:
FIG. 7A is a cross-sectional view showing a process in the method for manufacturing the mode converter according to the embodiment of the invention.

FIGS. 7A to 7P are front sectional views sequentially showing processes of manufacturing a main portion of the glass substrate in stages during the manufacture of the waveguide.

First, as shown in FIG. 7A, as a preparation process, the glass substrate 101 serving as a base is prepared. For example, the glass substrate 101 is a large-area glass substrate having a wafer shape and has a thickness of 850 μm.

[First Process]

Figure 7B:
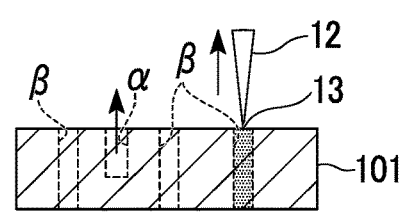
FIG. 7B is a cross-sectional view showing a process in the method for manufacturing the mode converter according to the embodiment of the invention.

Then, as shown in FIG. 7B, as a first process, the glass substrate 101 is irradiated with laser light and a modified portion (first modified portion) α and a modified portion (second modified portion) β are formed.

The modified portion α is formed to a desired depth corresponding to the length H4 of the pin 123. A plurality of modified portions β corresponding to the plurality of conductor posts 114 are formed so as to pass through the glass substrate 101. The modified portions β are formed such that they have a diameter d and the distance X between two adjacent modified portions β is less than the diameter d. For example, a substrate which is made of Pyrex (registered trademark) can be used as the glass substrate 101. Femtosecond laser light having a pulse width of 250 fs is used as the laser light. The laser light is focused and radiated to scan the glass substrate, thereby forming the modified portions. The dimensions (length and thickness) of the modified portions α and β can be controlled according to laser irradiation conditions (the size of the focal point and the scanning distance).

[Second Process]

Then, as a second process, the modified portion α and the modified portion β are removed by etching. In the etching process, etching is performed by immersing the glass substrate 101 having the modified portions α and β formed therein in a predetermined chemical in a container (not shown). Then, the modified portion α is wet-etched by the chemical from a first main surface (front surface) 101a of the glass substrate 101 and the modified portion β is wet-etched by the chemical from two main surfaces of the glass substrate 101. As a result, the modified portion α and the modified portion β are removed in the glass substrate 101.

Figure 7C:
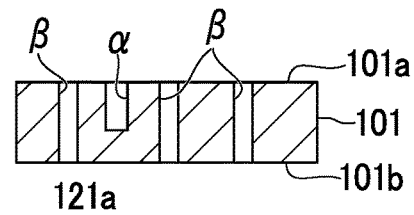
FIG. 7C is a cross-sectional view showing a process in the method for manufacturing the mode converter according to the embodiment of the invention.

As shown in FIG. 7C, a micro hole α and a micro hole β are formed in the portions corresponding to the removed modified portions α and β. In this embodiment, an acid solution having hydrofluoric acid as a main component or an alkali solution having potassium hydroxide as a main component can be used as the chemical. In the second process, etching is performed using a phenomenon in which a non-modified portion is more rapidly etched than a modified portion. The use of this phenomenon makes it possible to form the micro holes α and β based on the shape of the modified portions α and β. In this embodiment, the diameter of the micro holes α and β can be appropriately set in the range of 10 μm to 300 μm depending on the purpose of the portion to be manufactured.

The micro hole α formed by the above-mentioned method (the modification of the substrate by laser irradiation and the etching of the modified portion with the acid solution) has a shape in which the bottom thereof is rounded as shown in FIG. 6A. Therefore, the pin formed in the micro hole α has an end-rounded shape as shown in FIG. 6A.

[Third Process]

Then, as a third process, the micro hole α and the micro hole β formed in the second process are filled with a conductive material and the pin 123 and the conductor post 114 are formed.

Figure 7D:
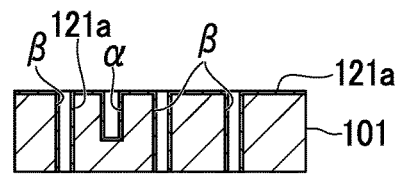
FIG. 7D is a cross-sectional view showing a process in the method for manufacturing the mode converter according to the embodiment of the invention.
Figure 7E:
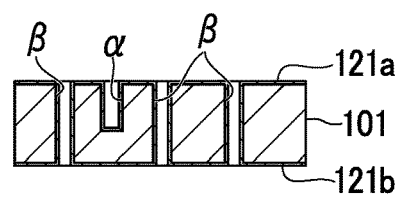
FIG. 7E is a cross-sectional view showing a process in the method for manufacturing the mode converter according to the embodiment of the invention.

First, as shown in FIG. 7D, a seed layer 121a is formed on the front surface 101a of the glass substrate 101 and in the micro holes α and β. As shown in FIG. 7E, a seed layer 121b is formed on the second main surface (rear surface) 101b of the glass substrate 101. The seed layers 121a and 121b have, for example, a layer structure of Cr/Cu or a layer structure of Ti/Cu. The thickness of the seed layers 121a and 121b is in the range of 10 nm to 500 nm. The seed layers 121a and 121b can be formed by a sputtering method.

Figure 7F:
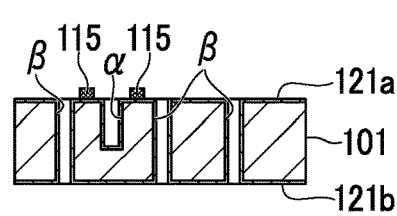
FIG. 7F is a cross-sectional view showing a process in the method for manufacturing the mode converter according to the embodiment of the invention.

Then, as shown in FIG. 7F, a plating resist 115 is formed around the micro hole α on the seed layer 121a. The resist 115 has a circular ring shape in a plan view on the front surface 101a of the glass substrate and is formed so as to cover a region corresponding to the opening 111a which is arranged in the outer circumference of the micro hole α and the land 123c. The inside diameter H3 of the resist 115 is set considering the outside diameter H3 of the land 123c. For example, a liquid negative resist, a film-shaped negative resist, a liquid positive resist, or a film-shaped positive resist can be used as the resist 115.

Figure 7G:
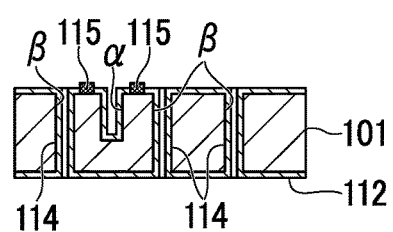
FIG. 7G is a cross-sectional view showing a process in the method for manufacturing the mode converter according to the embodiment of the invention.

Then, as shown in FIG. 7G, a copper layer is formed on the surfaces of the seed layers 121a and 121b except for the resist 115 by a plating method to form a layer which will be the pin 123, the first and second grounding conductor layers 111 and 112, and the conductor post 114. The pin 123 is formed in the micro hole α and on a portion of the front surface 101a of the glass substrate which will be the land 123c around the micro hole α. The first grounding conductor layer 111 is formed on the outside of the opening 111a of the glass substrate front surface 101a. The conductor post 114 is formed in the micro hole β.

The second grounding conductor layer 112 is formed on the seed layer 121b formed on the rear surface 101b of the glass substrate 101.

It is preferable that the thickness of the copper-plated layer is greater than at least a surface depth at which current density increases when a high-frequency signal in a millimeter-wave band flows. When a high-frequency signal of 60 GHz is used, the surface depth is 270 nm. Therefore, a thickness of approximately 2 μm is enough.

The micro holes α and β may or may not be completely filled with the pin 123 and the conductor post 114 by copper plating.

Figure 7H:
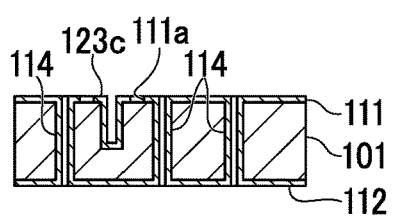
FIG. 7H is a cross-sectional view showing a process in the method for manufacturing the mode converter according to the embodiment of the invention.

Then, as a resist removal process, the resist 115 is removed as shown in FIG. 7H. In addition, the remaining seed layer 121*a* is etched. In this way, the first grounding conductor layer 111, the land 123*c*, and the opening portion 111*a* are formed.

[Fourth Process]

Figure 7I:
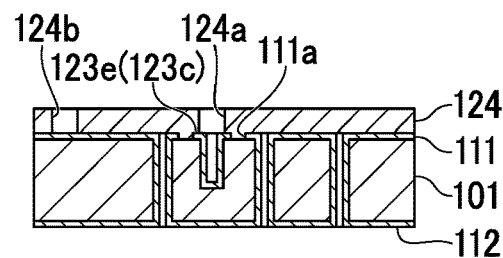
FIG. 7I is a cross-sectional view showing a process in the method for manufacturing the mode converter according to the embodiment of the invention.

Then, as a fourth process, as shown in FIG. 7I, the insulating portion 124 is formed on the first grounding conductor layer 111 and the surface outer edge portion 123*d* which is an outer circumferential portion of the land 123*c*. An opening portion 124*a* is formed in a part of the insulating portion that corresponds to the micro hole α which will be the pin 123 and the circular ring portion 123*e* which is an inner circumferential portion of the land 123*c* provided around the micro hole α. An opening portion 124*b* is formed in a portion which will be the GND via 127 that is a termination portion of the plane circuit (transmission line) 122. That is, the insulating portion 124 is not formed in the opening portions 124*a* and 124*b*.

The diameter of the opening portion 124*a* in the vicinity of the micro hole α is set to H2. Therefore, as shown in FIG. 2, the outside diameter of the conductor 122*a* connected to the land 123*c* is set to H2.

As the fourth process, first, in order to form the insulating portion 124, for example, a liquid photosensitive resin is applied onto the first grounding conductor layer 111 and a portion of the front surface 111*a* of the glass substrate corresponding to the opening portion 111*a* by a spin coating method. Then, the opening portion 124*a* in the vicinity of the micro hole α and the opening portion 124*b* which will be the GND via 127 are removed by a photolithography method. In this way, the insulating portion 124 is formed. Then, the remaining photosensitive resin is hardened by a heat treatment.

When the photosensitive resin remains on the circular ring portion 123*e* in the opening portion 124*a*, a reactive ion etching (RIE) process using $CF_4$ gas or $O_2$ gas is preferably performed to remove the remaining photosensitive resin.

[Fifth Process]

Figure 7J:
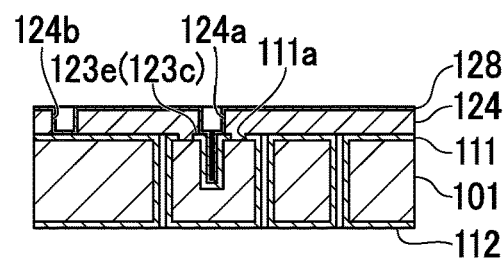
FIG. 7J is a cross-sectional view showing a process in the method for manufacturing the mode converter according to the embodiment of the invention.

Then, the transmission path 122 is formed. As shown in FIG. 7J, a seed layer 128 is formed on the surface of the insulating portion 124, on the circular ring portion 123*e* of the land 123*c*, in the micro hole α, and in the opening portion 124*b*. The seed layer 128 has the same layer structure as the seed layers 121*a* and 121*b*. For example, the seed layer 128 has a layer structure of Cr/Cu or Ti/Cu. The thickness of the seed layer 128 is in the range of 10 nm to 500 nm. The seed layer 128 can be formed by a sputtering method.

Figure 7K:
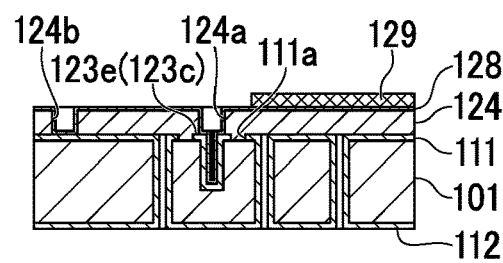
FIG. 7K is a cross-sectional view showing a process in the method for manufacturing the mode converter according to the embodiment of the invention.
Figure 7L:
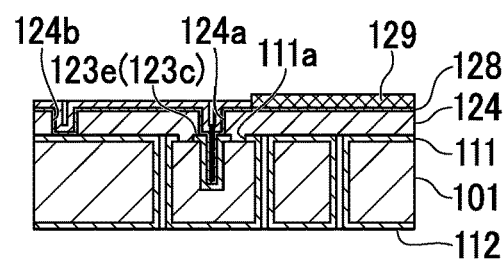
FIG. 7L is a cross-sectional view showing a process in the method for manufacturing the mode converter according to the embodiment of the invention.

Then, as a resist forming process which is performed before a transmission path forming process, as shown in FIG. 7K, a resist 129 is formed on the surface of the seed layer 128 except for a portion which will be the transmission path 122 by plating. The resist 129 is formed so as to cover a region other than the portion which will be the transmission path 122 and portions which will be the GSG pad 125, the GND pad 126, and the GND via 127. The material forming the resist 129 may be the same as that forming the resist 115.

Then, as the transmission path forming process, as shown in FIG. 7N, copper plating is performed for the surface of the seed layer 128 except for the resist 129 to form a layer which will be the transmission path 122. It is preferable that the thickness of the copper-plated layer is greater than at least a surface depth at which current density increases when a high-frequency signal in a millimeter-wave band flows. When a high-frequency signal of 60 GHz is used, the surface depth is 270 nm. Therefore, a thickness of about 2 μm is enough.

Figure 7M:
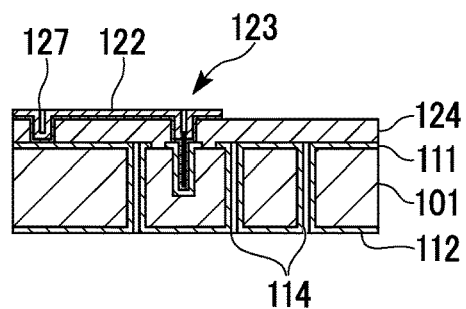
FIG. 7M is a cross-sectional view showing a process in the method for manufacturing the mode converter according to the embodiment of the invention.

Then, as shown in FIG. 7M, the resist 129 is removed and the seed layer 128 is etched. In this way, the transmission path 122 which will be a microstrip line is formed.

The mode converter 100 having the pin 123 can be formed on the glass substrate 101 by the above-mentioned processes.

In this embodiment, the glass substrate 101 which is a single member is used and the length of the modified portion α which will be the pin 123 can be set by modification using laser irradiation. Therefore, the pin 123 with any length can be formed as long as the length is within the thickness of the glass substrate 101. As a result, the length of the pin is not discrete, unlike the related art, and it is possible to obtain the optimal pin length at which the reflection of a signal is minimized. That is, it is possible to manufacture a mode converter which can effectively transmit a millimeter-wave signal transmitted from a wireless communication IC using the transmission path 122, without any loss.

It is considered that the state of impedance matching also depends on the diameter of the pin 123. In this embodiment, the diameter of the micro hole α which will be the pin 123 can be adjusted by etching conditions. Therefore, it is possible to adjust the diameter of the pin 123 with higher accuracy than the related art in which the diameter of the micro hole is defined only by drilling or laser machining.

In the mode converter 100 according to this embodiment, the pin 123 can be formed in the single glass substrate 101, unlike the related art in which a plurality of substrates are laminated and vias are connected to each other by the land structure of the interface between the laminated layers. Therefore, a land structure does not need to be provided in the middle of the pin and it is possible to reduce the adverse effect of signal reflection due to the land structure in which the diameter of the pin is not constant.

Figure 28:
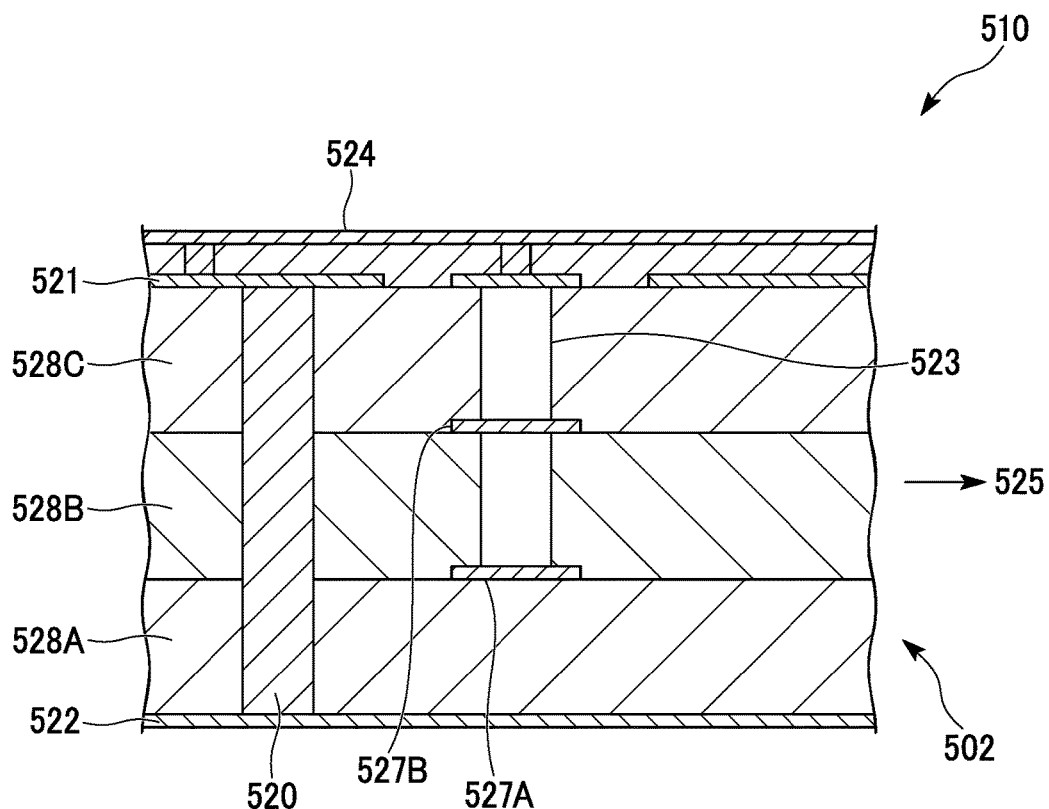
FIG. 28 is a front sectional view showing the mode converter according to the related art.

The mode converter 100 according to this embodiment does not include a laminate of a plurality of substrates shown in FIG. 28, but includes a single base. Therefore, it is possible to avoid all undesirable situations which occur when a plurality of bases are laminated, such as loss caused by an adhesive, a variation in the characteristics of each layer, and the positional deviation between layers.

According the manufacturing method of this embodiment, it is possible to form the pin 123 and the plurality of conductor posts 114 which will be the reflecting portion 110 in parallel at the same time. Therefore, the number of processes required for manufacturing and the number of man-hours are reduced. As a result, it is possible to reduce the work time and manufacturing cost.

In this embodiment, the outside diameter H3 of the outer edge portion 123*d* (the outside diameter of the land 123*c*), the outside diameter H2 of the conductor 122*a* connected to the land 123*c*, and the outside diameter H1 of the pin 123 are set such that H3>H2>H1 is satisfied. Therefore, it is possible to prevent the conductor 122a from protruding from the outer edge portion 123d.

In post-processing (when a resist or a resin is formed), when the outer edge portion 123d is misaligned, when the outside diameter H3 increases with respect to the outside diameters H2 and H1, the possibility that the cutting of a line due to the misalignment will be avoided increases.

According to this embodiment, since the glass substrate 101 is used, it is possible to achieve a mode converter which has lighter weight and smaller loss than the related art using a substrate (FR4) in which an epoxy resin includes glass cloth (fiber).

Figure 8:
FIG. 8 is a cross-sectional view schematically showing another example of the pin in the method for manufacturing the mode converter according to the embodiment of the invention.

In the above-described embodiment, as shown in FIG. 2, the diameter of the pin 123 is set so as to be constant from the base end 123b to the leading end 123a. However, the invention is not limited thereto. As shown in FIG. 8, in the cross section including a center line of the pin 123 in the thickness direction, an angle formed between a straight line which is parallel to the front surface 101a of the substrate and passes through the leading end 123a and a straight line indicating the side surface of the pin 123 may be θ0. That is, the pin 123 may be formed such that the diameter of the pin 123 at the leading end 123a is less than the diameter of the pin 123 at the base end 123b. In this case, a metal attachment effect in the micro hole α is improved and it is possible to reliably form the seed layer 121a using a sputtering method and to reliably form the first grounding conductor layer 111 using a plating method.

Figure 9:
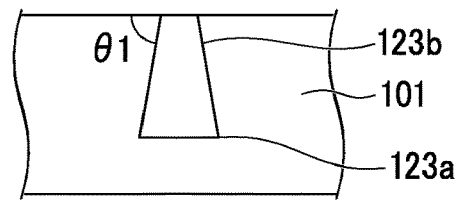
FIG. 9 is a cross-sectional view schematically showing another example of the pin in the method for manufacturing the mode converter according to the embodiment of the invention.

As shown in FIG. 9, in the cross section including the center line of the pin 123 in the thickness direction, an angle formed between a straight line indicating the front surface 101a of the substrate and a straight line indicating the side surface of the pin 123 may be θ1. That is, the pin 123 may be formed such that the diameter thereof at the leading end 123a is greater than the diameter thereof at the base end 123b. In this case, it is possible to smoothly introduce the millimeter-wave signal to the pin 123. In addition, it is possible to improve the efficiency of coupling to the waveguide. Therefore, it is possible to smoothly introduce the millimeter-wave signal to the pin 123.

Figure 10:
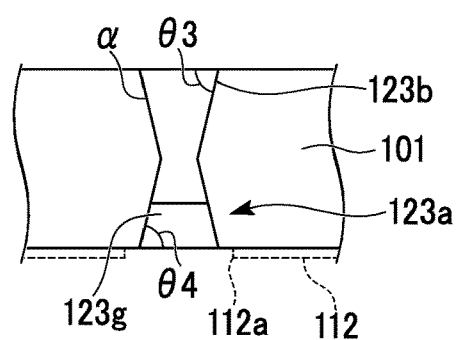
FIG. 10 is a cross-sectional view schematically showing another example of the pin in the method for manufacturing the mode converter according to the embodiment of the invention.

As shown in FIG. 10, in the cross section including the center line of the pin 123 in the thickness direction, an angle formed between a straight line indicating the front surface 101a of the substrate and a straight line indicating the side surface of the pin 123 may be θ3 and an angle formed between a straight line indicating the rear surface 101b of the substrate and a straight line indicating the side surface of the pin 123 may be θ4. That is, the diameter of the pin 123 may decrease and then increase from the base end to the leading end 123a such that the pin 123 is narrow in the middle. In this case, the micro hole α needs to pass through the rear surface 101b of the glass substrate 101 and an opening 112a needs to be formed in the conductor layer 112 such that the second grounding conductor layer 112 on the rear surface is separated from the pin 123. This structure can respond to a case in which the length H4 of the pin 123 is desired to be large. In addition, since the micro hole α is also formed in the rear surface 101b of the glass substrate 101, it is possible to reduce the etching time.

The formation of the angle θ3 and the angle θ4 makes it possible to improve the metal attachment effect in the micro hole α and to reliably form the seed layer 121a and the first grounding conductor layer 111 using copper plating.

As shown in FIG. 10, the end of the micro hole α which is close to the rear surface 101b may be closed with an insulating material 123g. In addition, the end of the micro hole α which is close to the front surface 101a may be closed with the insulating material 123g, which is not shown in the drawings.

As shown in FIG. 6A, the leading end 123a of the pin 123 may be formed so as to have curvature. The leading end 123a shown in FIG. 6A does not have the corners shown in, for example, FIGS. 2, 8, and 9. Therefore, the electric field which is generated between the pin 123 and the second grounding conductor layer 112 is not concentrated on the corner and it is possible to uniformize the electric field between the pin 123 and the second grounding conductor layer 112.

Figure 11:
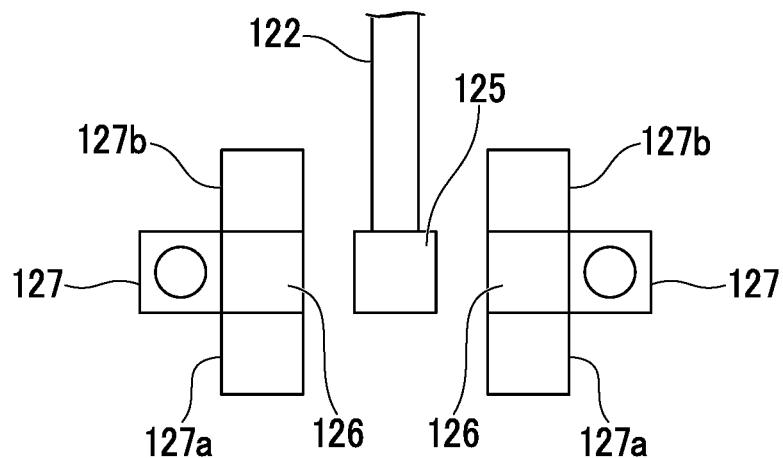
FIG. 11 is a plan view schematically showing another example of the GND via in the method for manufacturing the mode converter according to the embodiment of the invention.

In this embodiment shown in FIG. 3, the end of the transmission line 122 extending from the pin 123 is the GSG pad 125 and the GND via 127 is adjacent to the GND pad 126. However, the invention is not limited thereto. As shown in FIG. 11, the installation position of the GND via is not limited to a side 127 of the GND pad 126 which is opposite to the GSG pad 125. The GND via may be provided on a side 127a of the GND pad 126 which is far away from the pin 123. In addition, the GND via may be provided on a side 127b of the GND pad 126 which is close to the pin 123. FIG. 11 is a plan view simultaneously showing the GND vias which are provided at different positions relative to the GND pad 126 in order to describe the position of the GND via.

The GND via 127 may be provided at a position that is shifted by an arbitrary length in a direction from the GND pad 126 to the GND via 127a or may be provided at a position that is shifted by an arbitrary length in a direction from the GND pad 126 to the GND via 127b.

Figure 12:
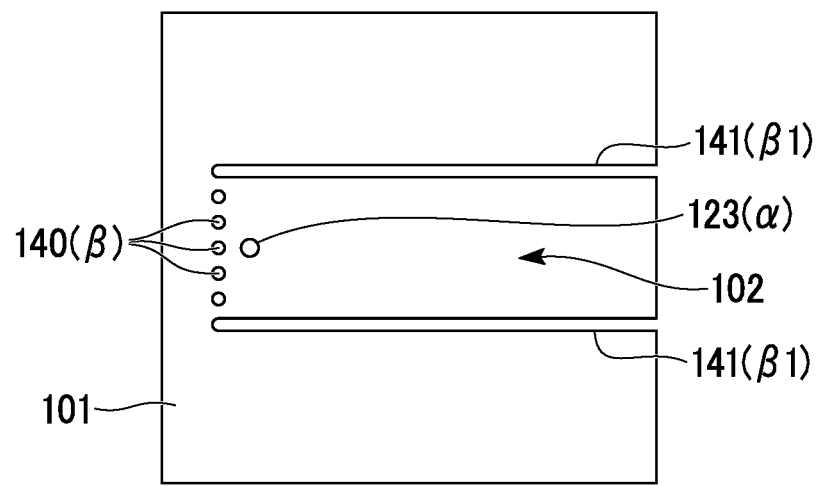
FIG. 12 is a plan view schematically showing another example of the reflecting portion in the method for manufacturing the mode converter according to the embodiment of the invention.

In this embodiment, as shown in FIG. 1, the reflecting portion 110 includes the plurality of conductor posts 114. However, the invention is not limited thereto. In the plan view of FIG. 1, among three sides formed by the reflecting portion 110, a side that will be a rear wall opposite to the opening portion 102 from which radio waves are radiated from the mode converter may be formed by a plurality of conductor posts 114, similar to FIG. 1, and two sides which extend in the direction from the pin 123 to the opening portion 102 may be conductor walls (electromagnetic wave shielding portions) 141 (β1) that are continuous in the direction, as shown in FIG. 12. In this case, in the first process and the second process, a continuous micro hole may be formed.

The side which will be the rear wall is formed by a plurality of conductor posts 140. Therefore, even when a defect, such as the electrical opening of some conductor posts, occurs, the performance of the mode converter can be maintained by the remaining conductor posts connected to the grounding conductor layers.

In addition, the conductor wall 141 serves as a side wall reflecting portion. This structure can more effectively prevent the leakage of electromagnetic waves than that in which a plurality of conductor posts are provided.

In this embodiment, as shown in FIG. 1, the glass substrate 101 extends to the outside of the opening portion 102 in a plan view. However, the invention is not limited thereto. As shown in FIG. 12, the conductor wall 141 may be formed so as to extend to the end of the glass substrate 101 such that the glass substrate 101 does not extend to the outside of the opening portion 102. In this case, the reflecting portion 110 formed by a plurality of conductor posts 140 is formed on a side of the pin 123 opposite to the side on which the opening is formed. Therefore, in the first process and the second process, even when a long hole β1 is formed in the glass substrate 101, the glass substrate 101 is not separated.

In this structure, since the side wall in the traveling direction of electromagnetic waves is a continuous wall, it is possible to prevent the disturbance of the mode of electromagnetic waves due to the discontinuous arrangement of conductors.

Figure 13:
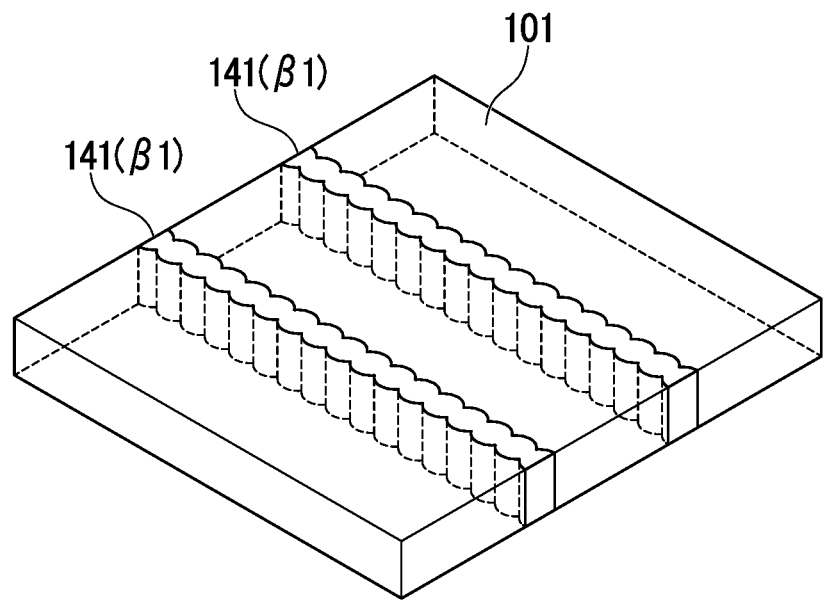
FIG. 13 is a perspective view showing another example of the reflecting portion in the method for manufacturing the mode converter according to the embodiment of the invention.

Among three sides formed by the reflecting portion 110, two sides which extend in the direction from the pin 123 to the opening portion 102 may be long holes β1 obtained by continuously forming a plurality of cylinders so as to overlap each other in a plan view, as shown in FIG. 13.

Figure 14:
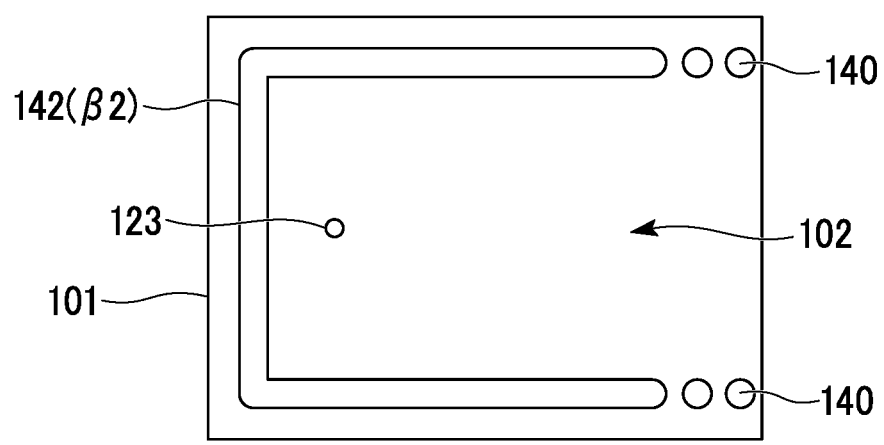
FIG. 14 is a plan view schematically showing another example of the reflecting portion in the method for manufacturing the mode converter according to the embodiment of the invention.

As shown in FIG. 14, the three sides formed by the plurality of conductor posts 114 (reflecting portion 110) can be formed by a conductor wall 142 which is a U-shaped continuous long hole β2 and the conductor posts 140 which are separated only in the vicinity of the opening portion 102. In this case, the pin is not surrounded by the posts, but the surrounding environment of the pin is a closed space. Therefore, it is possible to prevent leakage of electromagnetic waves from the pin when the electromagnetic waves are introduced.

Figure 15:
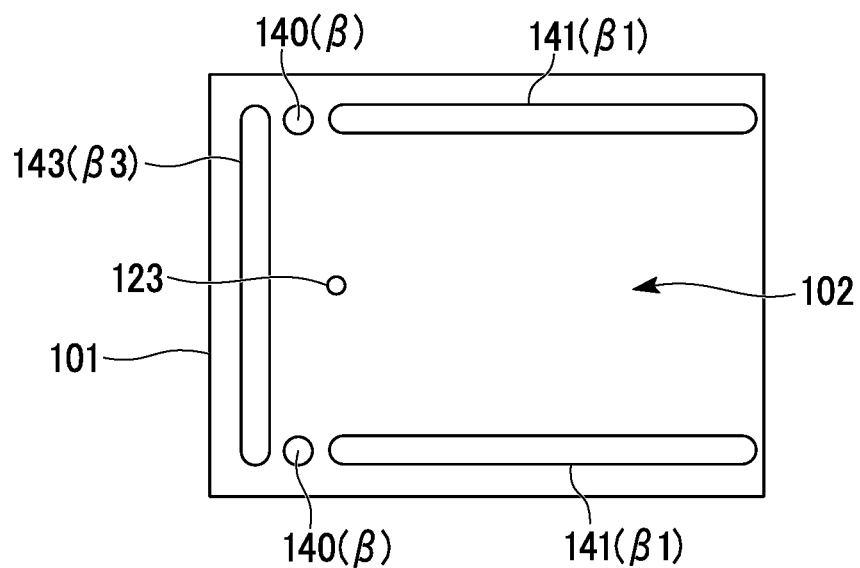
FIG. 15 is a plan view schematically showing another example of the reflecting portion in the method for manufacturing the mode converter according to the embodiment of the invention.

As shown in FIG. 15, among three sides formed by the reflecting portion 110, two sides which extend in the direction from the pin 123 to the opening portion 102 are formed by long holes β1 (conductor walls 141) and a side which will be the rear wall opposite to the opening portion 102 is formed by a long hole β3 (conductor wall 143). A conductor post 140 is provided in a region between the conductor wall 143 and each conductor wall 141 so as to be discontinuous with the conductor wall 143 and each conductor wall 141. In this case, since the only discontinuous portion is the post, it is possible to minimize the disturbance of the mode of electromagnetic waves in the discontinuous portion and to achieve a structure which is more mechanically stable than the structure shown in FIG. 14.

As such, when the reflecting portion 110 is discontinuous, the glass substrate is continuous inside the reflecting portion 110 (mode converter 100) and outside the reflecting portion 110. Therefore, the glass substrate 101 is not separated.

Figure 16:
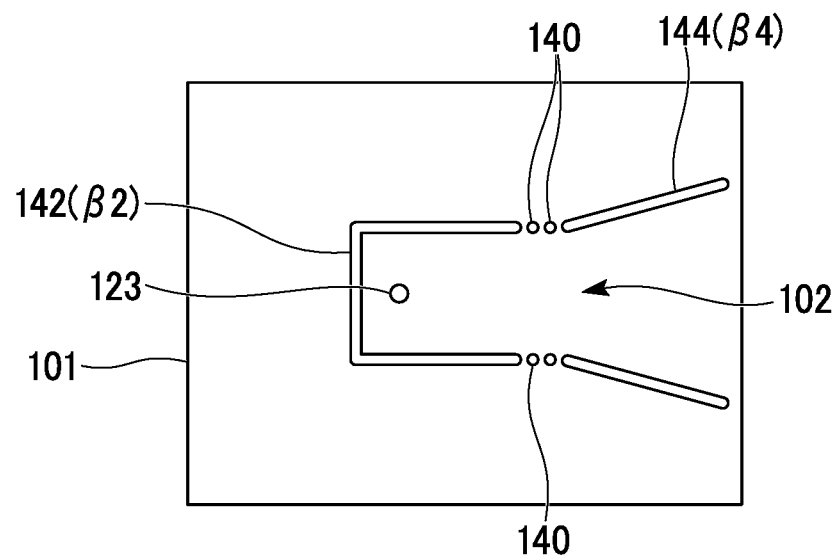
FIG. 16 is a plan view schematically showing another example of the reflecting portion in the method for manufacturing the mode converter according to the embodiment of the invention.

As shown in FIG. 16, another conductor wall 144 (long hole β4) which increases the width of the reflecting portion may be provided on the outside of the opening portion 102. In this case, it is possible to form an H-plane sectorial horn antenna and to improve an antenna gain.

In the invention, a method for combining the conductor post 114 and the conductor wall 144 for the electromagnetic wave shielding portion, a method for arranging the conductor post 114 and the conductor wall 144, and the arrangement shape of the conductor post 114 and the conductor wall 144 are not limited to the structures shown in FIG. 1 and FIGS. 12 to 16. The electromagnetic wave shielding portion may form an electromagnetic wave radiation portion which surrounds the pin 123 in plan view and can radiate electromagnetic waves from the pin 123 in one direction. It is preferable to design the electromagnetic wave shielding portion such that the glass substrate 101 is not separated when the micro hole β is formed.

Figure 17:
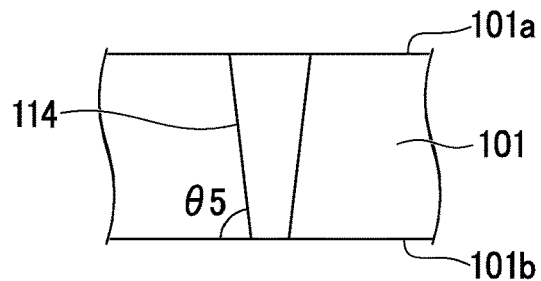
FIG. 17 is a plan view schematically showing another example of the reflecting portion in the method for manufacturing the mode converter according to the embodiment of the invention.

In the above-described embodiment, as shown in FIGS. 1 and 2, the diameter of the conductor post 114 is set so as to be constant from the front surface 101a to the rear surface 101b of the glass substrate 101. However, the invention is not limited thereto. As shown in FIG. 17, in the cross section including the center line of the pin 123 in the thickness direction, the diameter of the pin 123 may be reduced from the front surface 101a to the rear surface 101b such that an angle formed between a straight line indicating the rear surface 101b of the substrate and a straight line indicating the side surface of the pin 123 is θ5. In this case, it is possible to improve the metal attachment effect in the micro hole β and to reliably form the seed layer 121a and the conductor post 114 using copper plating. In addition, the formation of the angle θ5 makes it possible to improve the metal attachment effect in the micro hole α and to reliably form the seed layer 121a and the first grounding conductor layer 111 using copper plating.

Figure 18:
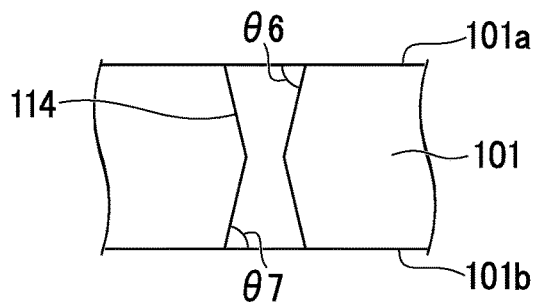
FIG. 18 is a plan view schematically showing another example of the reflecting portion in the method for manufacturing the mode converter according to the embodiment of the invention.

As shown in FIG. 18, in the cross section including the center line of the pin 123 in the thickness direction, the diameter of the pin 123 may be reduced and then increased from the front surface 101a to the rear surface 101b such that an angle formed between a straight line indicating the front surface 101a of the substrate and a straight line indicating the side surface of the pin 123 is θ6 and an angle formed between a straight line indicating the rear surface 101b of the substrate and a straight line indicating the side surface of the pin 123 is θ7. The formation of the angle θ6 and the angle θ7 makes it possible to improve the metal attachment effect in the micro hole α and to reliably form the seed layer 121a and the first grounding conductor layer 111 using copper plating.

Figure 19:
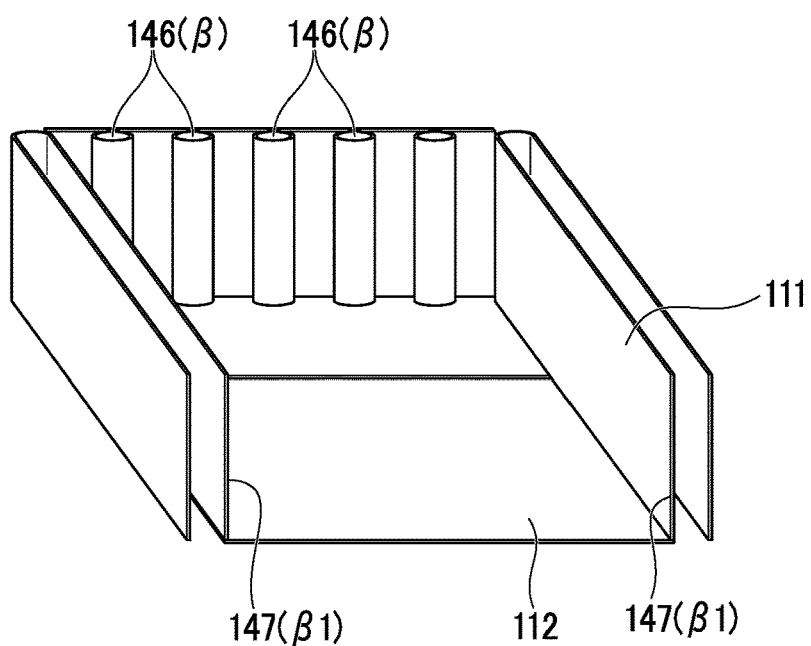
FIG. 19 is a perspective view schematically showing another example of the reflecting portion in the method for manufacturing the mode converter according to the embodiment of the invention.

As shown in FIG. 19, the micro hole β and the long hole β1 may not be filled with a conductor and may be hollow. In this case, the first and second grounding conductor layers 111 and 112 may be provided only in corresponding portions between the opposite inner surfaces of a conductor wall 147. In this case, it is preferable that both ends of the conductor posts 146 are reliably connected to the first and second grounding conductor layers 111 and 112.

As such, since the reflecting portion 110 includes the conductor walls 141, 142, 143, 144, and 147, it is possible to significantly reduce the leakage of electromagnetic waves, as compared to the case in which the reflecting portion 110 is formed only by a plurality of conductor posts 114. Therefore, it is possible to improve the radiation efficiency of an antenna and to reduce the radiation loss of a waveguide. Since the conductor wall is used, the area in which a current flow is larger than that when only the conductor posts 114 are used. Therefore, it is possible to significantly reduce the disturbance and breakdown of the transmission mode due to the electrical disconnection between the post wall 114 and the first and second grounding conductor layers 111 and 112, which are likely to occur in all of the post walls 114, and the risk thereof.

Figure 20:
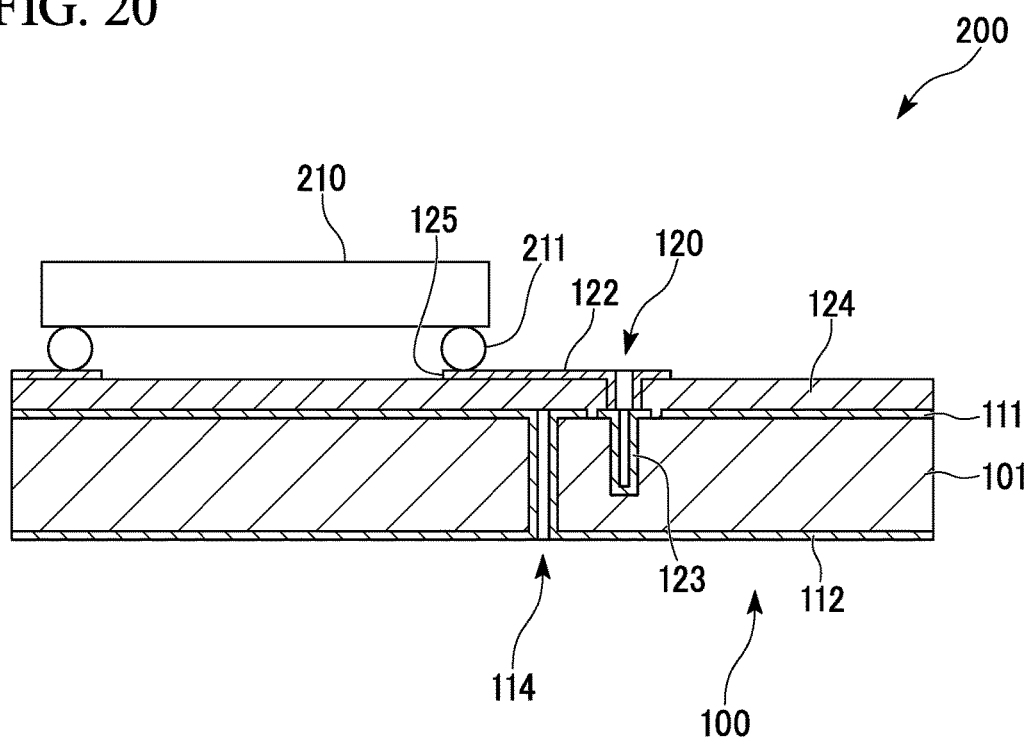
FIG. 20 is a cross-sectional view schematically showing an example of a millimeter-wave communication module in the method for manufacturing the mode converter according to the embodiment of the invention.

The mode converter 100 according to this embodiment may form a millimeter-wave communication module 200, as shown in FIG. 20. The millimeter-wave communication module 200 includes the mode converter 100 and a wireless communication IC (semiconductor chip) 210 having an element that has a wireless transmission and reception function, is provided as an example of the waveguide 100, and is connected to the upper surface of the wireless communication IC in a flip-chip manner. The first grounding conductor layer 111 which will be a GND layer, the transmission path 122 on the insulating portion 124, and a circuit (not shown) which is provided on the same layer as these components are provided on the front surface of the glass substrate 101 in which the mode converter 100 is formed. A terminal 211 of the wireless communication IC (semiconductor chip) 210 is connected to the end of the transmission line 122 through the GSG pad 125. The influence of parasitic inductance on a high-frequency signal in a millimeter-wave band is very large. Therefore, a short-distance connection using not wire bonding but a bump is preferable.

Figure 21:
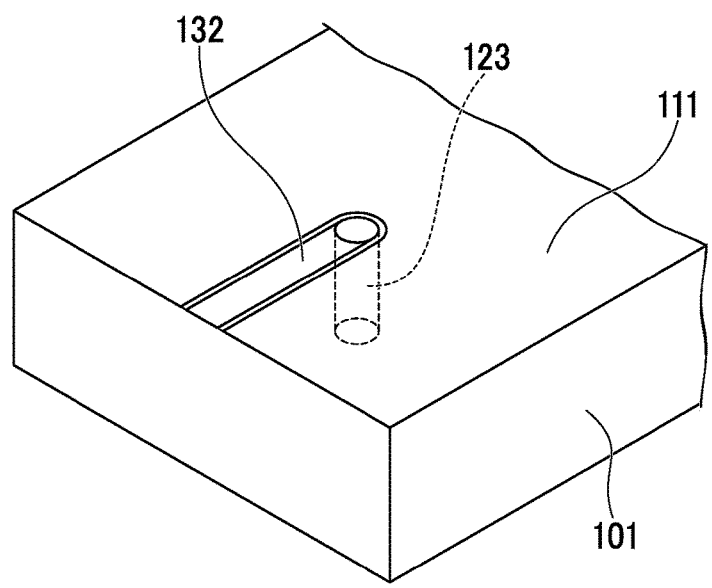
FIG. 21 is a perspective view showing another example of the pin in the method for manufacturing the mode converter according to the embodiment of the invention.

As shown in FIG. 3, the mode converter 100 according to this embodiment uses the microstrip line. However, as shown in FIG. 21, the mode converter 100 may use a coplanar strip line. In this case, a signal line 132 is formed on the same layer as the first grounding conductor layer 111 which will be an upper GND layer of a PWA.

EXPERIMENTAL EXAMPLE

Next, an experimental example of the invention will be described.

Figure 22:
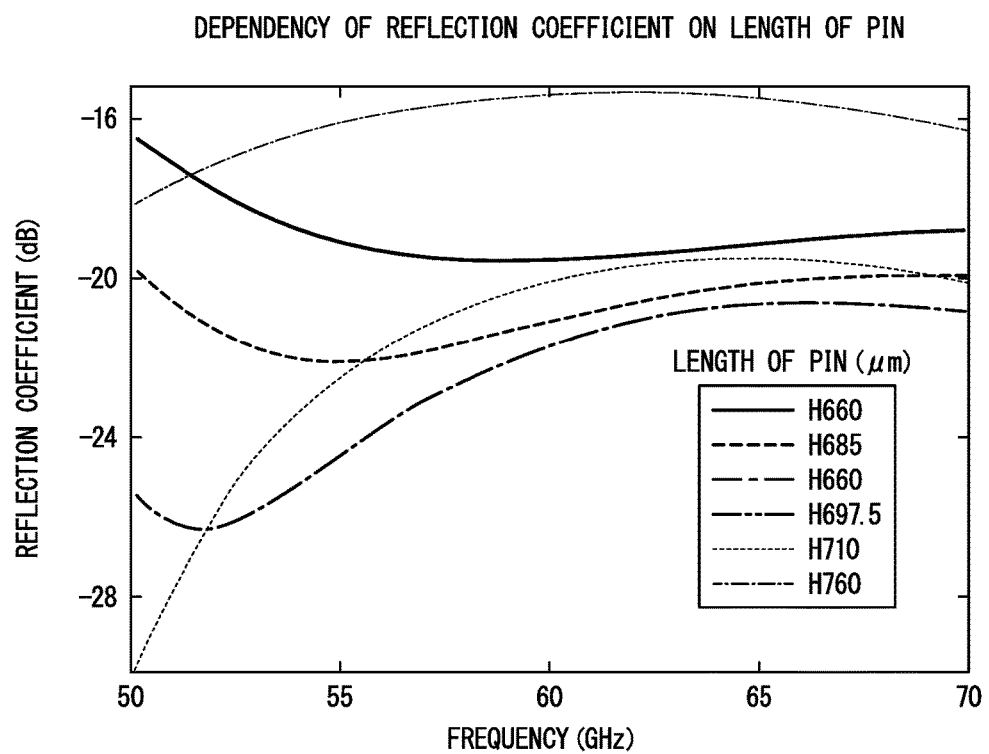
FIG. 22 is a graph showing the dependence of a reflection coefficient on the length of the pin in the method for manufacturing the mode converter according to the embodiment of the invention.

FIG. 22 is a graph showing the simulation results indicating the relationship between the length of a pin and reflection loss. In the legend shown in FIG. 22, numbers following H indicate the length of the pin (unit: μm).

Three-dimensional electromagnetic field analysis software HFSS was used for the simulation. The thickness of the glass substrate was set to 850 μm. As can be seen from the graph, there is an appropriate length of the pin at which a signal is not reflected at an assumed frequency. For example, as can be seen from the graph, for a 60-GHz millimeter wave which is generally used to transmit signals, when the length of the pin is 697.5 μm, the reflection of the signal is the minimum. In the design of a high-frequency circuit, it is preferable that a reflection coefficient is equal to or less than −20 dB.

Figure 23:
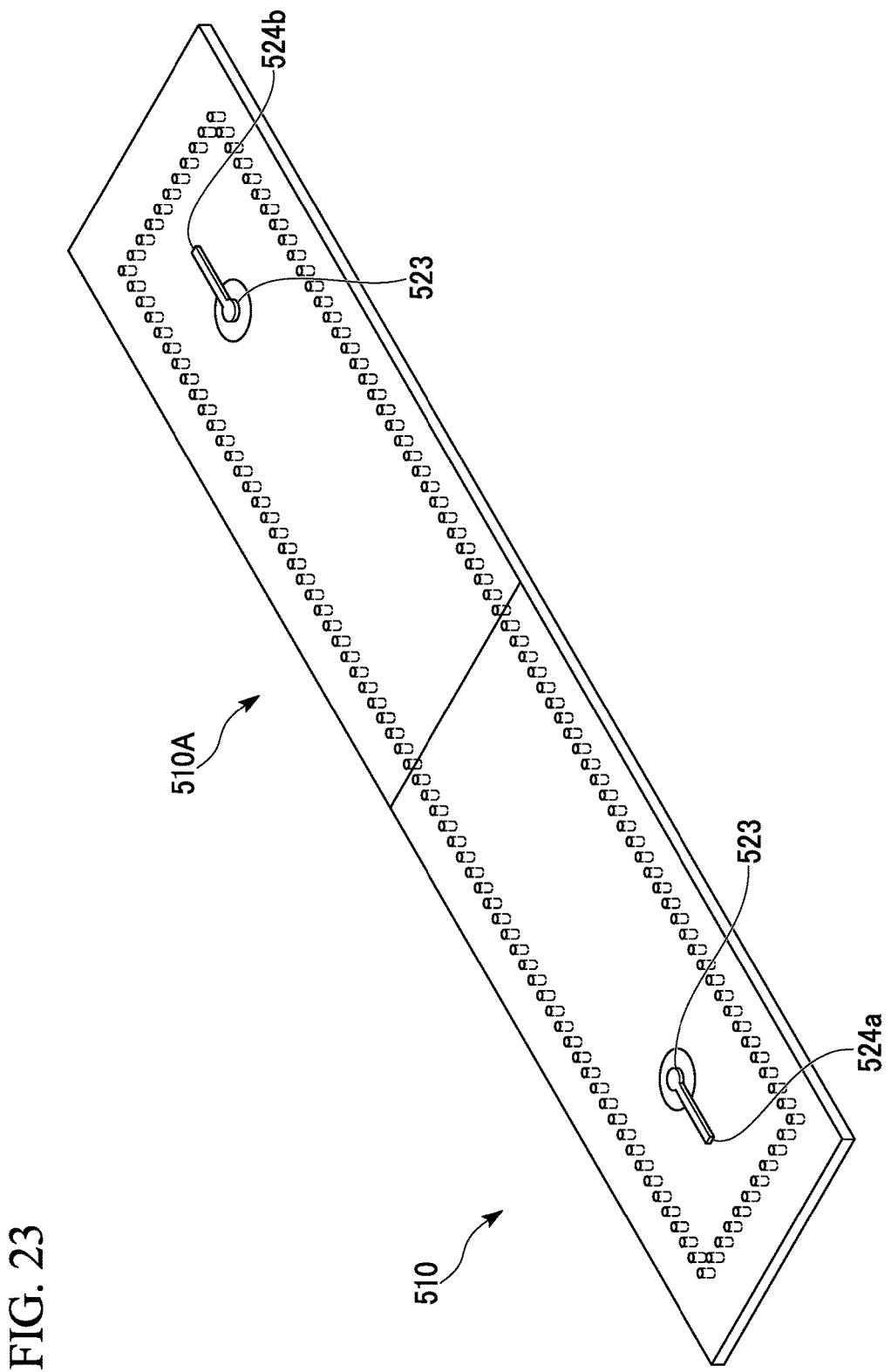
FIG. 23 is a perspective view showing a mode converter according to the related art which is simulated as an experimental example.

FIG. 23 shows a simulation model in the laminated-structure-type mode converter according to the related art shown in FIG. 28. In this type, openings of printed circuit board post-wall waveguides (PWW) 510 and 510A having the pins 523 provided therein are arranged so as to face each other. Signal input/output ports are a port 524a and a port 524b provided at the ends of a microstrip line 524. The transmission mode (quasi-TEM mode) of a microstrip is converted into a TE10 mode which is the transmission mode of a waveguide through the pin 523. The distance between the centers of the pins 523 was set to 10 mm.

Figure 24:
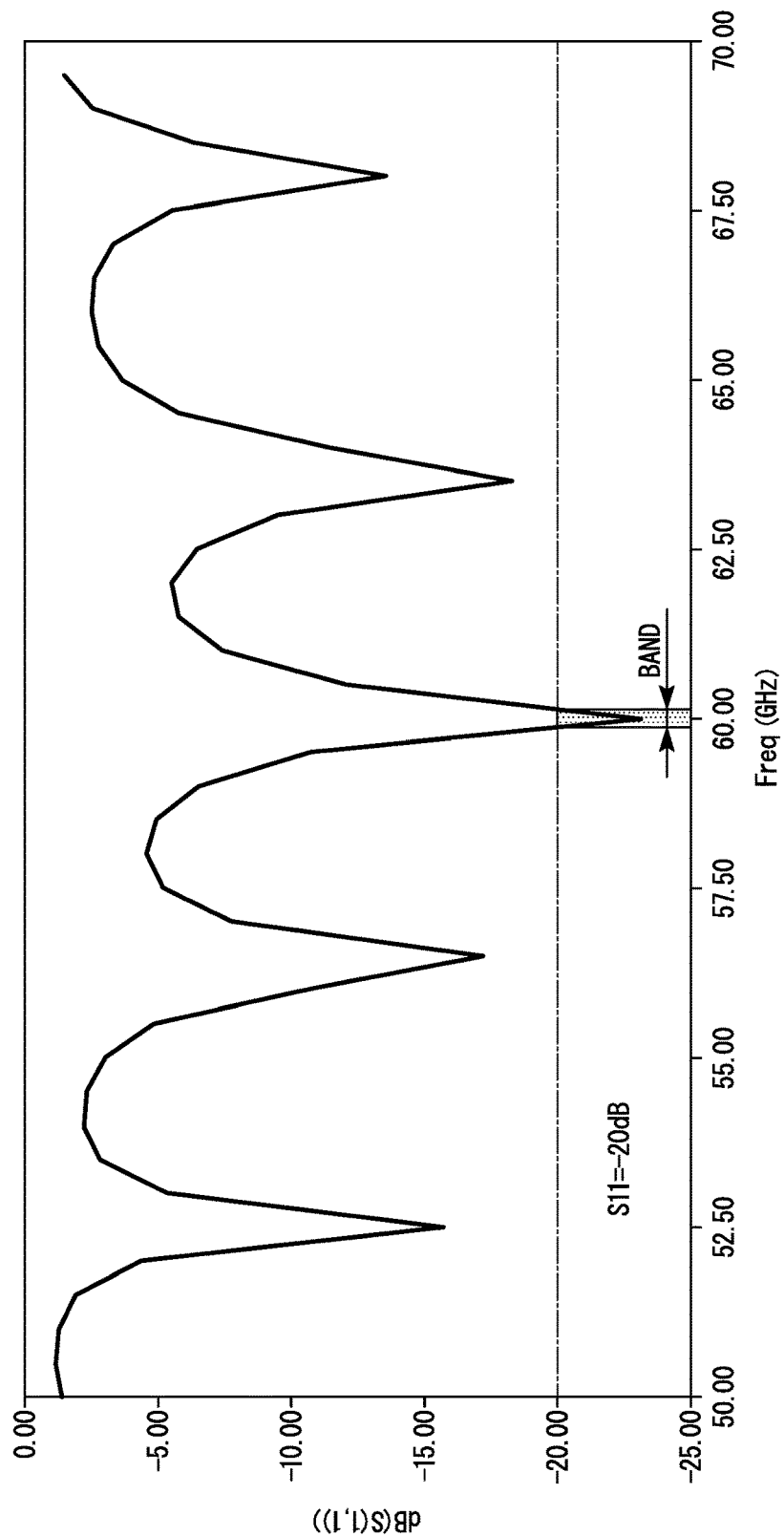
FIG. 24 is a graph showing the simulation results of a frequency band in the mode converter according to the related art as the experimental example.

FIG. 24 is a graph showing the simulation results of the reflection coefficient of the printed circuit board post-wall waveguide using the simulation model according to the related art shown in FIG. 23. The distance between the pin and the rear post wall was optimized at 60 GHz. The length of the pin was set to a specific value which could be achieved by the laminated structure of the substrate according to the related art. In general, it is preferable to design a microwave circuit such that reflection loss is less than −20 dB. In this graph, a frequency range in which S11<−20 dB is satisfied is defined as a band.

The results shown in FIG. 24 proved that, since the distance between the pin and the rear post wall was optimized at 60 GHz, reflection loss was less than −20 dB in a band of approximately 1 GHz in the vicinity of 60 GHz. That is, the band is approximately 1 GHz.

However, since a band width of 7 GHz to 9 GHz is used for specific power-saving 60-GHz wireless communication, the method according to the related art does not meet the specifications of this application.

It is considered that this is because the length of the pin has only a specific value in the related art and sufficient impedance matching is not obtained.

Figure 25:
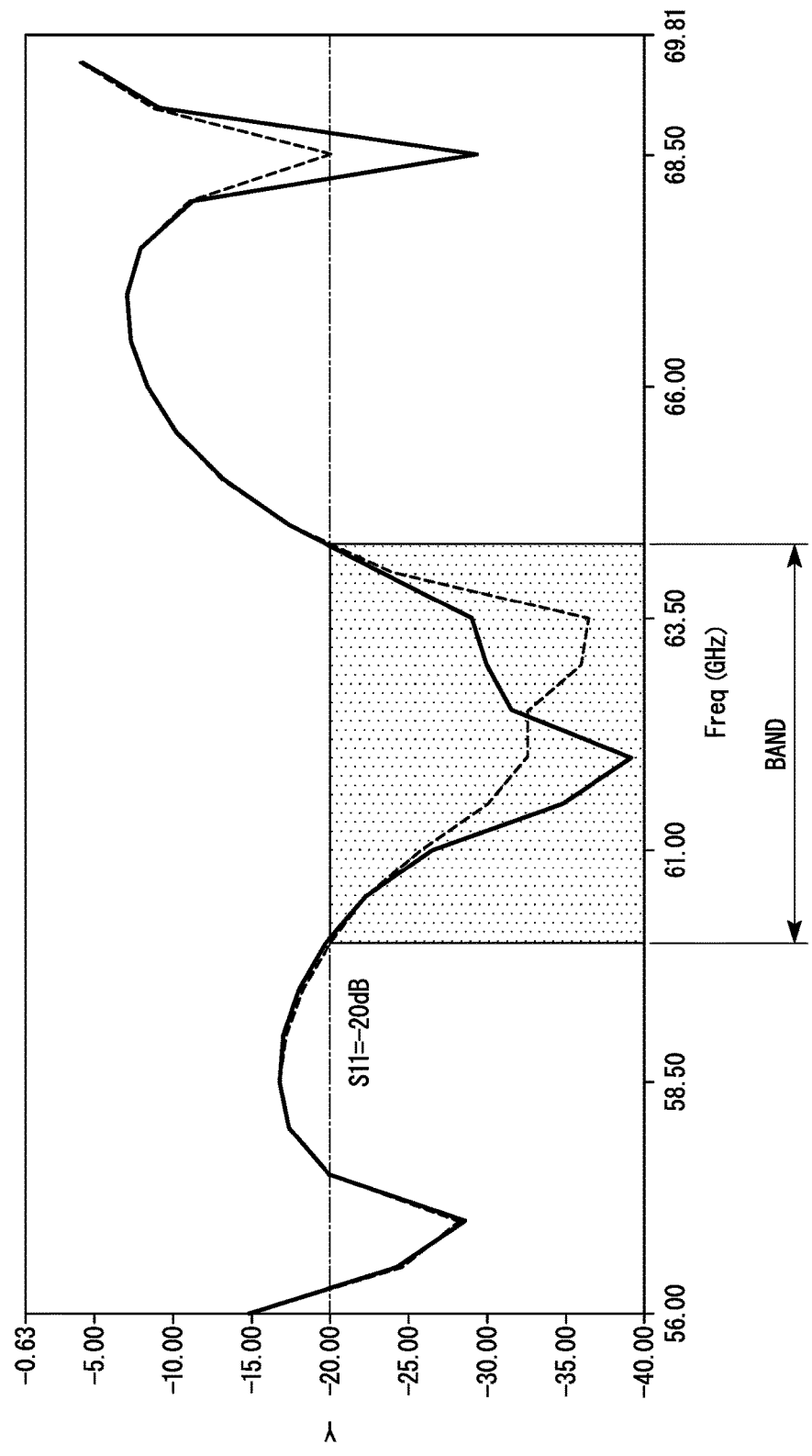
FIG. 25 is a graph showing the simulation results of the frequency band which is adjusted in the mode converter according to the related art as the experimental example.

FIG. 25 shows the simulation results after an impedance matching element is provided on the outside of a waveguide and the length of a pin is adjusted, in order to solve the impedance mismatching problem which is caused by the impossibility of freely adjusting the length of the pin in the related art.

The results proved that the band was significantly widened from approximately 1 GHz, which was the previous result, to 4 GHz by an impedance matching operation. However, since the band width of the application is 7 GHz, the degree of improvement is insufficient.

Figure 26:
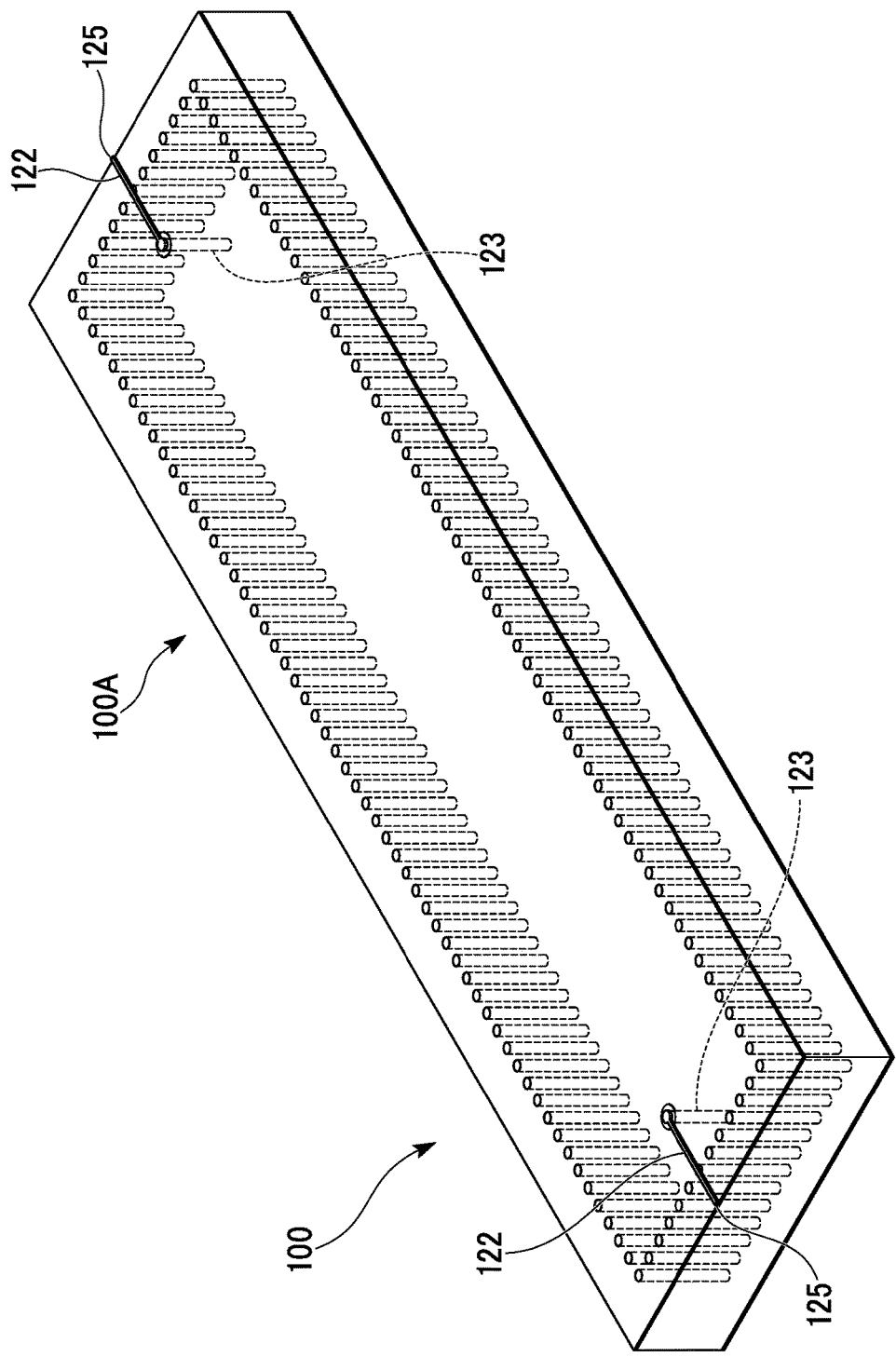
FIG. 26 is a perspective view showing a mode converter which is simulated in an embodiment of the method for manufacturing the mode converter according to the invention.

FIG. 26 shows a simulation model of a glass post-wall waveguide (PWW) in which a pin is formed by the mode converter manufacturing method according to the invention. Signal input/output ports are the ends 125 of microstrip lines and the transmission mode (quasi-TEM mode) of a microstrip is converted into a TE10 mode which is the transmission mode of a waveguide through the pin 123.

The distance between the centers of excitation vias was set to 10 mm.

Figure 27:
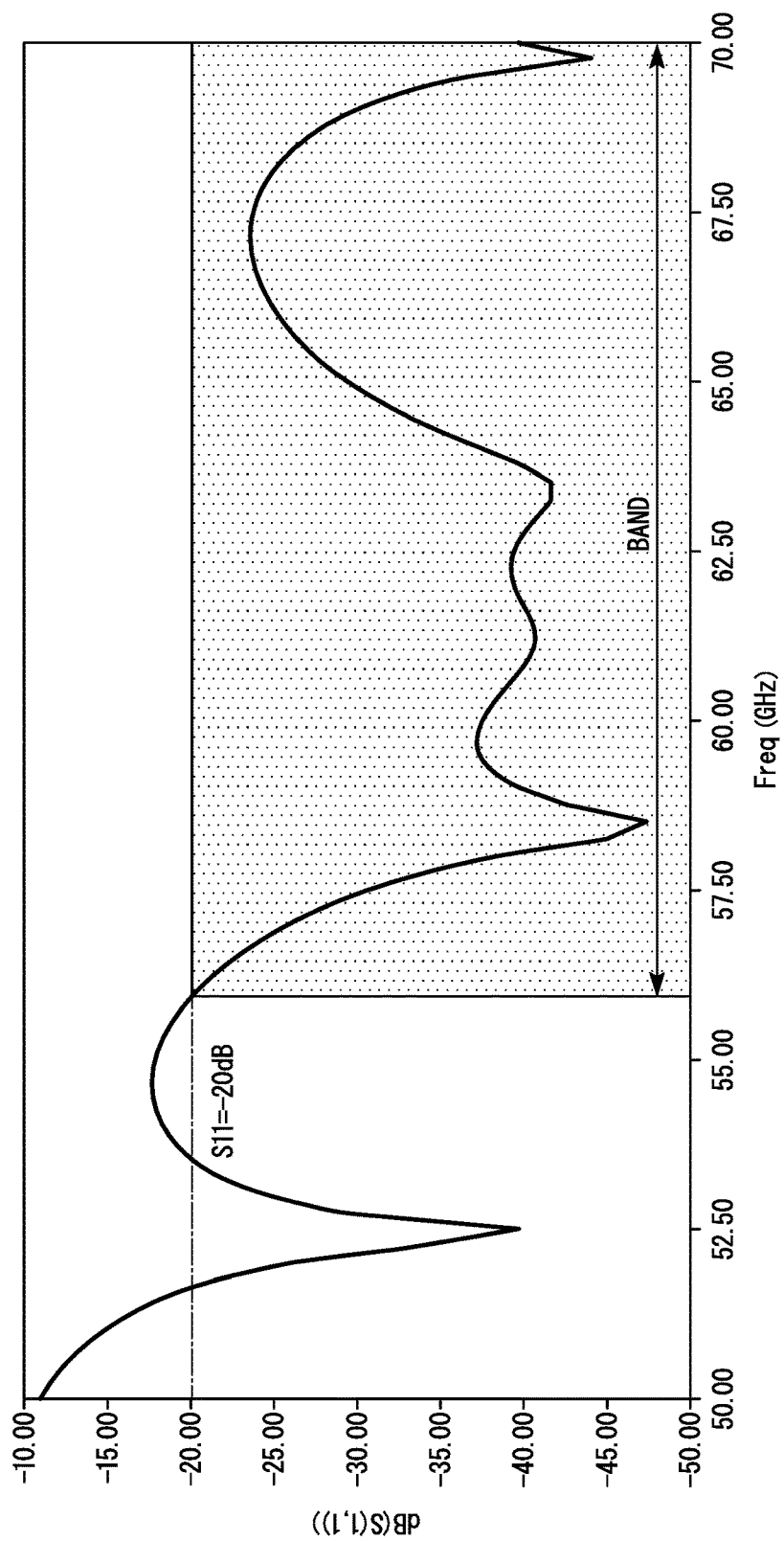
FIG. 27 is a graph showing the simulation results of a frequency band in an embodiment of the method for manufacturing the mode converter according to the invention.

FIG. 27 is a graph showing the simulation results of the glass post-wall waveguide (PWW) shown in FIG. 26 in which the pin is formed by the mode converter manufacturing method according to the invention. The distance between the pin and the rear post wall was optimized at 60 GHz. In addition, the length of the pin was optimized at 60 GHz. In general, it is preferable to design a microwave circuit such that reflection loss is less than −20 dB. In this graph, a frequency range in which S11<−20 dB is satisfied is defined as a band.

The results shown in FIG. 27 proved that, since both the distance between the pin and the rear post wall and the length of the pin were optimized at 60 GHz, a wide band of 14 GHz or more from 55.5 GHz could be ensured in at least this example.

This shows that it is possible to sufficiently satisfy a band of 60 GHz that does not require the licenses of all the countries of the world that are set in the range of 57 GHz to 66 GHz.

The invention can be widely applied to a high-capacity communication device which uses a millimeter-wave band and has a high transmission speed of several gigabits per second.

What is claimed is:

1. A method for manufacturing a mode converter, the method comprising:

irradiating a substrate, which is a single member and includes a first main surface and a second main surface opposite to the first main surface with a thickness between the first and second main surfaces, with pulse laser light of Femtosecond laser from the first main surface toward the second main surface and thereby forming a first modified portion extending from the first main surface toward the second main surface with a predetermined depth from the first main surface of the substrate, wherein the predetermined depth is less than the thickness between the first and second main surfaces;

after irradiating the substrate, removing the first modified portion to form a micro hole in the first main surface so as to have the predetermined depth;

forming grounding conductor layers on the first main surface and the second main surface;

forming a plane circuit on the first main surface so as to transmit a high-frequency signal; and filling the micro hole with a conductive material and forming a pin so as to cover an inner surface of the micro hole and be electrically connected to the plane circuit.

2. The method for manufacturing a mode converter according to claim 1, wherein the grounding conductor layers are formed at the same time as the pin is formed.

3. The method for manufacturing a mode converter according to claim 1,
- wherein the mode converter further includes an electromagnetic wave shielding portion that passes through the substrate from the first main surface to the second main surface and is arranged so as to surround the micro hole in a plan view,
- when the first modified portion is formed, the substrate is irradiated with the laser light and a second modified portion is formed so as to extend from the first main surface to the second main surface and to surround the micro hole in a plan view,
- the second modified portion is removed at the same time as the first modified portion is removed, and
- a portion from which the second modified portion is removed is filled with a conductive material to form the electromagnetic wave shielding portion at the same time as the micro hole is filled with the conductive material.

* * * * *